United States Patent
Degai et al.

(10) Patent No.: US 10,355,098 B2
(45) Date of Patent: Jul. 16, 2019

(54) METHOD OF MANUFACTURING SEMICONDUCTOR DEVICE

(71) Applicant: HITACHI KOKUSAI ELECTRIC INC., Tokyo (JP)

(72) Inventors: Motomu Degai, Toyama (JP);
Masanori Nakayama, Toyama (JP);
Kazuhiro Harada, Toyama (JP);
Masahito Kitamura, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/988,078

(22) Filed: Jan. 5, 2016

(65) Prior Publication Data
US 2016/0196980 A1 Jul. 7, 2016

(30) Foreign Application Priority Data

Jan. 6, 2015 (JP) ................................. 2015-000877

(51) Int. Cl.
*H01L 21/00* (2006.01)
*H01L 29/45* (2006.01)
(Continued)

(52) U.S. Cl.
CPC ............ *H01L 29/458* (2013.01); *C23C 16/34* (2013.01); *C23C 16/4554* (2013.01); *C23C 16/45534* (2013.01); *C23C 16/505* (2013.01); *H01L 21/32051* (2013.01); *H01L 21/28562* (2013.01); *H01L 21/76862* (2013.01)

(58) Field of Classification Search
CPC ......... H01L 21/28562; H01L 21/32051; H01L 21/76862
See application file for complete search history.

(56) References Cited

U.S. PATENT DOCUMENTS

| | | | | |
|---|---|---|---|---|
| 4,113,515 | A * | 9/1978 | Kooi | H01L 21/00 438/287 |
| 2006/0216932 | A1* | 9/2006 | Kumar | C23C 14/02 438/641 |

(Continued)

FOREIGN PATENT DOCUMENTS

| | | |
|---|---|---|
| JP | 07221048 A | 8/1995 |
| JP | 2010-027928 A | 2/2010 |

(Continued)

OTHER PUBLICATIONS

Japanese Office Action for Japanese Patent Application No. 2015-000877 dated Oct. 6, 2016 (with English Translation).

*Primary Examiner* — Richard A Booth
(74) *Attorney, Agent, or Firm* — Volpe and Koenig, P.C.

(57) ABSTRACT

The present invention provides a technology capable of removing impurities remaining in a thin film when the film is formed and modifying a characteristic of the thin film according to a change in impurity concentration. There is provided a method of manufacturing a semiconductor device including: (a) repetitively supplying a plurality of gases including elements constituting a film in temporally separated pulses (in non-simultaneous manner) to form the film on the substrate; and (b) exciting a modifying gas including a reducing gas and at least one of a nitriding gas and an oxidizing gas by plasma and supplying the modifying gas excited by plasma to modify the film.

16 Claims, 21 Drawing Sheets

(51) Int. Cl.
*H01L 21/3205* (2006.01)
*C23C 16/34* (2006.01)
*C23C 16/455* (2006.01)
*C23C 16/505* (2006.01)
*H01L 21/285* (2006.01)
*H01L 21/768* (2006.01)

(56) References Cited

U.S. PATENT DOCUMENTS

| | | | |
|---|---|---|---|
| 2009/0130331 A1 | 5/2009 | Asai et al. | |
| 2013/0149852 A1* | 6/2013 | Nakamura | H01L 21/28079 438/585 |

FOREIGN PATENT DOCUMENTS

| | | | |
|---|---|---|---|
| WO | 2007020874 | A1 | 2/2007 |
| WO | 2011162255 | A1 | 12/2011 |
| WO | 2013086232 | A1 | 6/2013 |

* cited by examiner

US 10,355,098 B2

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of Japanese Patent Application No. 2015-000877, filed on Jan. 6, 2015, in the Japanese Patent Office, the entire contents of which are hereby incorporated by reference.

BACKGROUND OF THE INVENTION

1. Field of the Invention

The present invention relates to a method of manufacturing a semiconductor device, a substrate processing apparatus, a substrate processing system and a computer program.

2. Description of the Related Art

Recently, in semiconductor devices, miniaturization has been proceeding, and film thinning is required. For example, a film used in the semiconductor device includes a conductive thin film, an insulating thin film or the like (see Patent Document 1).

RELATED ART DOCUMENT

Patent Document

[Patent Document 1]
Japanese Laid-open Patent Application No. 2011-6783

SUMMARY OF THE INVENTION

As a method of forming a thin film, there is a method by which a process gas which is a source of a thin film is supplied onto a substrate to form a thin film having an element included in the source as a component on the substrate using the reaction with the substrate. In this case, elements other than the desired element included in the source may remain as impurities on the thin film formed on the substrate. As the thin film forming proceeds, an influence of the impurities on the characteristic of the formed thin film cannot be ignored.

The present invention provides a technique capable of removing an impurity remaining in a thin film when the film is formed and modifying a characteristic of the thin film according to a change in impurity concentration.

According to an aspect of the present invention, there is provided a method of manufacturing a semiconductor device including:

(a) repetitively supplying a plurality of gases including elements constituting a film in temporally separated pulses (in non-simultaneous manner) to form the film on the substrate; and (b) exciting a modifying gas including a reducing gas and at least one of a nitriding gas and an oxidizing gas by plasma and supplying the modifying gas excited by plasma to modify the film.

DETAILED DESCRIPTION OF THE PREFERRED EMBODIMENTS

Figure 1:
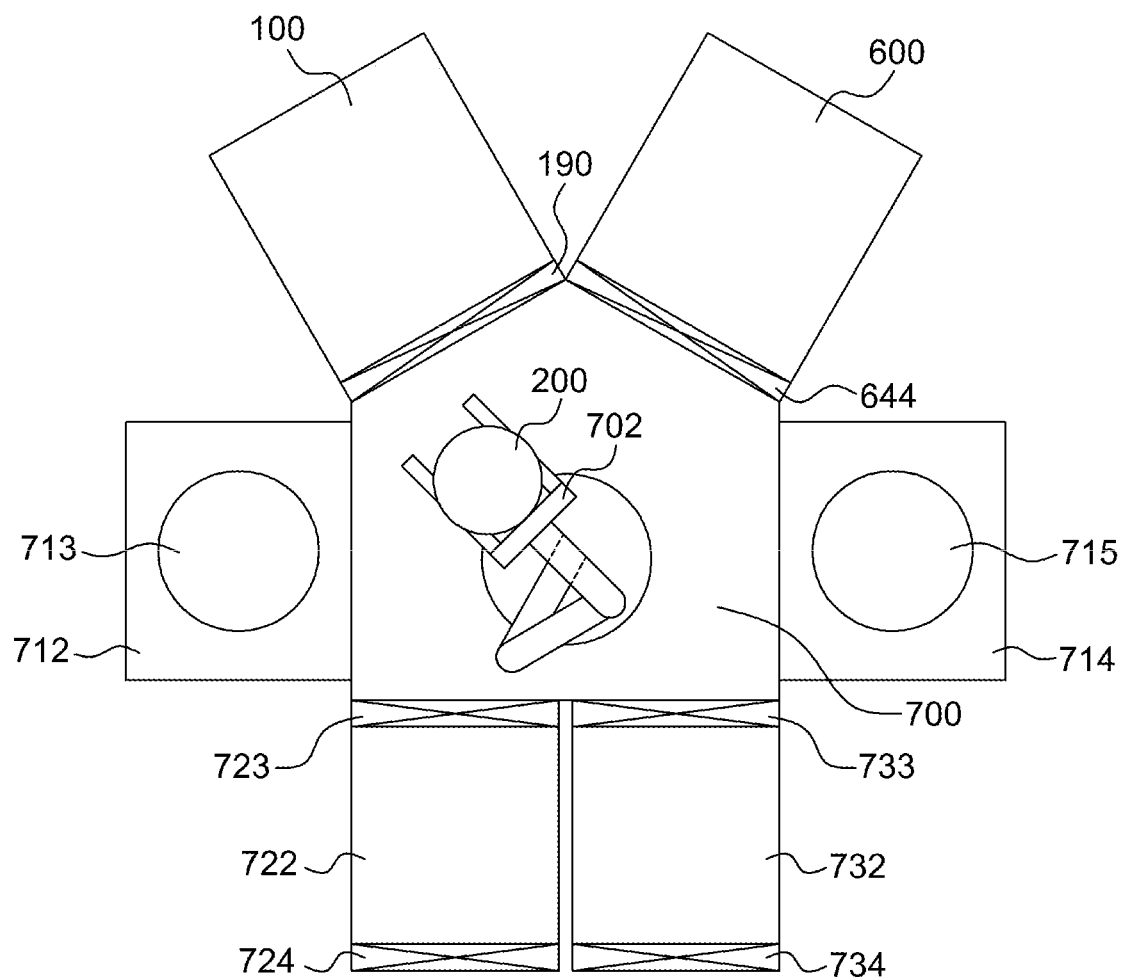
FIG. 1 is a schematic cross-sectional view for describing a substrate processing system preferably used in a first embodiment of the present invention.

A film used in a semiconductor device may include, for example, a conductive thin film, an insulating thin film or the like as described above. Here, the conductive thin film will be described. Recently, in a large-scale integration (LSI) manufacturing process, a transistor has a gate stack structure in which a high-k film having a high dielectric constant of more than 4 is formed on silicon (Si), and a conductive thin film is formed on the high-k film to control a threshold voltage of the transistor. In order to control the power consumption of the transistor, various conductive thin films are used as gate electrodes.

The conductive thin films therein have a unique work function (WF) of thin film. The threshold voltage ($V_{th}$) of the transistor may be controlled by tuning (adjusting, modifying or controlling) the work function. The threshold voltage is determined by the work function of the electrode. A metal nitride film [e.g., a titanium nitride film (a TiN film)] and the like may be used as a metal gate electrode. In the transistor, the work functions required for a P-type transistor and an N-type transistor are different from each other. The P-type transistor requires 4.9 eV or more and the N-type transistor requires 4.3 eV or less. Also, in order to suppress standby power of the transistor, a conductive thin film having a work function (about 4.6 eV) in the vicinity of the mid-gap is also required. Also, other values may be required according to the application. In this case, the work function may be preferably adjusted by one film with a single-element composition.

In order to address these requirements, for example, a conductive thin film of which a work function on a hafnium oxide film (a HfO film) is 4.9 eV or more and whose work function is modifiable is required (a strong p-metal). A titanium nitride film (a TiN film) serving as a metal gate electrode has various advantages such as high reliability, low resistivity, excellent step coverage and the like, but the work function on the HfO film is about 4.8 eV lower than the requirement.

However, when the conductive thin film is formed, among constituent elements of a process gas used in the formation of the thin film, constituent elements other than an element that forms the desired thin film may remain in the conductive thin film as impurities. The resistivity of the conductive thin film is increased due to the impurities, and thus the work function thereof may be decreased.

The inventors have studied and found that the resistivity of the TiN film can be decreased by forming an amorphous TiN film (α-TiN film) containing an impurity and supplying active species having high energy to the TiN film. Since a bonding force of Ti included in the α-TiN film containing an impurity and other elements (e.g., N, C, Cl or the like) is weak, the bond is cut by active species having high energy and a crystallized TiN film may be re-generated. A method of generating active species having high energy may include a method of exciting by plasma, a method of exciting by light, a method of exciting by a hot wire and the like. Hereinafter, as an example, the method of exciting by plasma will be described.

First, a plasma is generated in atmospheres of hydrogen ($H_2$) gas which is a reducing gas, a hydrogen-containing gas, and nitrogen ($N_2$) gas which is a nitriding gas, and a nitrogen-containing gas, and the TiN film containing an impurity is exposed in the plasma. In this case, H active species generated by exciting the hydrogen ($H_2$) gas by plasma bond with C or Cl which is an impurity in the TiN film to become HCl, $CH_3$, $NH_4Cl$ or the like and depart from the TiN film. By such a reduction reaction, C or Cl which is an impurity is removed from the TiN film. Also, N active species generated by exciting the nitrogen ($N_2$) gas by plasma are added to the TiN film from which an impurity is removed, but the N active species have high energy and the crystallization of the TiN film is facilitated by the energy. When the TiN film is crystallized, the resistivity is lowered. Also, when the N active species are added to the TiN film, N concentration is increased. Here, a work function of a material is correlated to the electronegativity of the element that composes the material. When the electronegativity on Pauling's scale is X and the work function is W, since there is a relationship such as by the following Formula 1, the work function is increased as the electronegativity of the element is increased or decreased in proportion to the electronegativity of the element is decreased.

$$W=2.27X+0.34 \qquad \text{[Formula 1]}$$

Therefore, when a concentration of N having a high electronegativity with respect to Ti having a low electronegativity is increased, the work function may be increased. That is, the work function is modifiable by changing the N concentration. Also, the work function is modifiable by changing a concentration of C or Cl which is an impurity. That is, the complete removal of impurities may not be necessary according to the characteristic of the desired thin film. For example, since C has lower electronegativity than N and the influence of increasing the work function is minimal, a portion where N is positioned is occupied by C, and when the N concentration is decreased relatively, the work function of the film may be decreased compared to a case in which a gas not containing C is used.

In this manner, when plasma is supplied to the thin film after the thin film including the impurities is formed, the impurities remaining in the thin film when the film has been formed may be removed and the characteristic of the thin film may be modified according to the change in impurity concentration. Hereinafter, a detailed description will be provided.

First Embodiment of the Present Invention

Hereinafter, a first embodiment of the present invention will be described with reference to FIGS. 1 to 3. A substrate processing system 10 is configured as an example of an apparatus used in a substrate processing process which is a process among processes of manufacturing a semiconductor device and includes a substrate processing apparatus 100 used for forming a thin film on a wafer 200 serving as a substrate, a substrate processing apparatus 600 used for performing a heat treatment and a plasma treatment on the substrate on which the thin film is formed, and a transfer chamber 700 used for moving the substrate between these substrate processing apparatuses. A transfer mechanism 702 is installed in the transfer chamber 700.

Load lock chambers 722 and 732 and spare chambers 712 and 714 are installed at side walls of the transfer chamber 700. A gate valve 190 is installed between the substrate processing apparatus 100 and the transfer chamber 700, a gate valve 644 is installed between the substrate processing apparatus 600 and the transfer chamber 700, a gate valve 723 is installed between the load lock chamber 722 and the transfer chamber 700 and a gate valve 733 is installed between the load lock chamber 732 and the transfer chamber 700. A gate valve 724 is installed at a side wall opposite a side wall of the load lock chamber 722 at which the gate valve 723 is installed, and a gate valve 734 is installed at a side wall opposite a side wall of the load lock chamber 732 at which the gate valve 733 is installed.

First, the substrate processing apparatus 100 will be described. In the following description, a case in which a substrate processing apparatus which is a batch-type vertical apparatus for performing a film forming process or the like on a plurality of substrates at a time is used as an example of the substrate processing apparatus 100 will be described.

(1) Configuration of Processing Furnace of Substrate Processing Apparatus 100

A heater 207 serving as a heating means (heating mechanism or heating system) is installed in a processing furnace 202. The heater 207 is formed in a cylindrical shape whose upper portion is closed.

A reaction tube 203 constituting a reaction container (process container) is provided concentrically with the heater 207 in the heater 207. The reaction tube 203 is made of a heat-resistant material [e.g., quartz ($SiO_2$) or silicon carbide (SiC)] and is formed in a cylindrical shape whose upper end is closed and whose lower end is open.

A manifold 209 of a metal material, such as stainless or the like, is installed below the reaction tube 203. The manifold 209 is formed in a tubular shape whose lower opening is airtightly sealed by a seal cap 219 serving as an object made of a metal material such as stainless or the like. O rings 220 serving as seal members are respectively installed between the reaction tube 203 and the manifold 209 and between the manifold 209 and the seal cap 219. The process container mainly includes the reaction tube 203, the manifold 209 and the seal cap 219, and a process chamber 201 is formed inside the process container. The process chamber 201 is configured such that wafers 200 serving as substrates may be accommodated in a horizontal orientation to be arranged on multiple stages in a vertical direction by a boat 217 to be described below.

A rotating mechanism 267 configured to rotate the boat 217 is installed at a side opposite the process chamber 201 of the seal cap 219. A rotary shaft 255 of the rotating mechanism 267 passes through the seal cap 219 and is connected to the boat 217. The rotating mechanism 267 is configured to rotate the wafer 200 by rotating the boat 217. The seal cap 219 is configured to be vertically moved upward and downward by a boat elevator 115 serving as a lifting mechanism which is vertically installed at the outside of the reaction tube 203. The boat elevator 115 is configured to load and unload the boat 217 into or out of the process chamber 201 by moving the seal cap 219 upward and downward. That is, the boat elevator 115 is configured as a transfer device (transfer mechanism) configured to transfer the boat 217, that is, the wafer 200, into or out of the process chamber 201.

The boat 217 serving as a substrate support is configured to support the plurality of wafers 200 on multiple stages, for example, 25 to 200 wafers 200, which are vertically arranged in a horizontal orientation while the centers thereof are aligned, that is, to support the wafers arranged to have gaps. The boat 217 is made of a heat-resistant material (e.g., quartz or SiC). An insulating plate 218 of a heat-resistant material (e.g., quartz or SiC) is supported in a horizontal orientation on multiple stages below the boat 217. According to such a configuration, heat from the heater 207 is not easily transferred to the seal cap 219. However, the present embodiment is not limited to the above-described configuration. For example, without installing insulating plate 218 below the boat 217, an insulating tube configured as a tubular member made of a heat-resistant material such as quartz or SiC may be installed. The heater 207 may heat the wafer 200 accommodated in the process chamber 201 to a predetermined temperature.

Nozzles 410 and 420 are installed in the process chamber 201 to pass through a side wall of the manifold 209. Gas supply pipes 310 and 320 serving as gas supply lines are connected to the nozzles 410 and 420, respectively. In this manner, the nozzles 410 and 420 and the gas supply pipes 310 and 320 are configured to supply a plurality of types of gases (a process gas and a source gas) into the process chamber 201.

Mass flow controllers (MFCs) 312 and 322 serving as flow rate controllers (flow rate control units) and valves 314 and 324 serving as opening and closing valves are sequentially installed from an upstream end in the gas supply pipes 310 and 320, respectively. The nozzles 410 and 420 are connected to front ends of the gas supply pipes 310 and 320, respectively. Each of the nozzles 410 and 420 is configured as an L-shaped long nozzle whose horizontal portion is installed to pass through the side wall of the manifold 209. A vertical portion of each of the nozzles 410 and 420 is installed in a cylindrical space formed between an inner wall of the reaction tube 203 and the wafer 200 so as to be lifted upward [in a direction in which the wafers 200 are arranged] along the inner wall of the reaction tube 203 [i.e., to be lifted from one end to the other end of a wafer arrangement region]. That is, the nozzles 410 and 420 are installed along the wafer arrangement region in which the wafers 200 are arranged, in a region which horizontally surrounds the wafer arrangement region at sides of the wafer arrangement region.

Gas supply holes 410a and 420a configured to supply (spray) gases are installed at side surfaces of the nozzles 410 and 420, respectively. The gas supply holes 410a and 420a are open toward the center of the reaction tube 203. A plurality of gas supply holes 410a and 420a are installed from a lower portion to an upper portion of the reaction tube 203 and are installed to each have the same opening area and at the same opening pitch.

In this manner, in a method of supplying a gas in the present embodiment, the gas is transferred through a longitudinally extending space having a cylindrical shape defined by an inner sidewall of the reaction tube 203 and ends of the plurality of loaded wafers 200, that is, through the nozzles 410 and 420 disposed in the cylindrical space. The gas is initially sprayed into the reaction tube 203 in the vicinity of the wafer 200 through the gas supply holes 410a and 420a which are open at the nozzles 410 and 420, respectively. A main flow of the gas in the reaction tube 203 is set to a direction parallel to surfaces of the wafers 200, that is, a horizontal direction. In such a configuration, it is possible to uniformly supply the gas onto each of the wafers 200, thereby uniformizing a film thickness of a thin film formed on each of the wafers 200. Also, the gas flowing along the surfaces of the wafers 200, that is, a residual gas after a reaction, flows toward an exhaust port, that is, toward the exhaust pipe 231 to be described below. However, a flow direction of the residual gas is not limited to the vertical direction, but may be appropriately defined according to a position of the exhaust port.

Also, carrier gas supply pipes 510 and 520 configured to supply a carrier gas are connected to the gas supply pipes 310 and 320, respectively. MFCs 512 and 522 and valves 514 and 524 are installed in the carrier gas supply pipes 510 and 520, respectively.

As an example in the configuration, a source gas serving as a process gas is supplied into the process chamber 201 through the gas supply pipe 310 via the MFC 312, the valve 314 and the nozzle 410. As the source gas, titanium tetrachloride ($TiCl_4$), for example, which is a titanium-containing source including titanium (Ti) which is a metal element serving as a first element, and for example, an inorganic source gas and a halogen-based source gas (a halogen-based source and a halide) is used. Titanium (Ti) is classified as a transition metal element. Halide is a compound containing a halogen which is a group 17 element, and includes fluoride containing fluorine (F), chloride containing chlorine (Cl), bromide containing bromine (Br), iodide containing iodine (I) and astatide containing astatine (At). Titanium tetrachloride ($TiCl_4$) is a chloride including Cl.

A first reaction gas that reacts with a source gas serving as a process gas is supplied from the gas supply pipe 320 into the process chamber 201 through an MFC 322, a valve 324 and a nozzle 420. As the first reaction gas, for example, ammonia ($NH_3$) which is a nitrogen-containing gas including nitrogen (N) serving as a second element is used. Ammonia ($NH_3$) acts as a nitriding agent and a reducing agent.

As an inert gas, for example, a nitrogen ($N_2$) gas is supplied into the process chamber 201 through the carrier gas supply pipes 510 and 520 via the MFCs 512 and 522, the valves 514 and 524 and the nozzles 410 and 420.

Here, in this specification, the source gas (the process gas) refers to a source in a gaseous state, for example, a gas that can be obtained by evaporation or sublimation of a source in a liquid state or solid state under room temperature and normal pressure or a source in a gaseous state under room temperature and normal pressure. When the term "source" is used in this specification, it may refer to "a liquid source in a liquid state," "a solid source in a solid state," "a source gas in a gaseous state" or a composition thereof. When a liquid source in a liquid state under room temperature and normal pressure such as $TiCl_4$ or the like or a solid source in a solid state under room temperature and normal pressure is used, the liquid source or the solid source is vaporized or sublimated by a system such as a vaporizer, a bubbler, a sublimator or the like and then is supplied as a source gas ($TiCl_4$ gas or the like).

When the above-described process gas flows through the gas supply pipes 310 and 320, a process gas supply system mainly includes the gas supply pipes 310 and 320, the MFCs 312 and 322 and the valves 314 and 324. The nozzles 410 and 420 may be included in the process gas supply system. The process gas supply system may be referred to simply as a gas supply system.

When a titanium-containing gas (Ti source gas) serving as a process gas flows through the gas supply pipe 310, a titanium-containing gas supply system mainly includes the gas supply pipe 310, the MFC 312 and the valve 314. The nozzle 410 may be included in the titanium-containing gas supply system. When a halogen-based source gas serving as a titanium-containing gas flows, the titanium-containing gas supply system may be referred to as a halogen-based source gas supply system. The titanium-containing gas supply system may be referred to as a titanium-containing source supply system and simply as a Ti source supply system. When the $TiCl_4$ gas flows through the gas supply pipe 310, the titanium-containing gas supply system may also be referred to as a $TiCl_4$ gas supply system. The $TiCl_4$ gas supply system may also be referred to as a $TiCl_4$ supply system.

When the first reaction gas serving as a process gas flows through the gas supply pipe 320, a first reaction gas supply system mainly includes the gas supply pipe 320, the MFC 322 and the valve 324. The nozzle 420 may be included in the first reaction gas supply system.

When a nitriding and reducing agent serving as the first reaction gas flows through the gas supply pipe 320, a nitriding and reducing agent supply system mainly includes the gas supply pipe 320, the MFC 322 and the valve 324. The nozzle 420 may be included in the nitriding and reducing agent supply system. When the nitrogen-containing gas (N source gas) serving as the nitriding and reducing agent flows, the nitriding and reducing agent supply system may be referred to as a nitrogen-containing gas supply system. When the $NH_3$ gas flows through the gas supply pipe 320, the nitrogen-containing gas supply system may be referred to as an $NH_3$ gas supply system The $NH_3$ gas supply system may be referred to as an $NH_3$ supply system.

Also, a carrier gas supply system mainly includes the carrier gas supply pipes 510 and 520, the MFCs 512 and 522 and the valves 514 and 524. When an inert gas serving as a carrier gas flows, the carrier gas supply system may be referred to as an inert gas supply system. Since the inert gas also acts as a purge gas, the inert gas supply system may be referred to as a purge gas supply system.

An exhaust pipe 231 that exhausts an atmosphere in the process chamber 201 is installed in the manifold 209. The exhaust pipe 231 is installed to pass through the side wall of the manifold 209, similar to the nozzles 410 and 420. The exhaust pipe 231 is installed at a position opposite the nozzles 410 and 420 with the wafer 200 therebetween as illustrated in FIG. 3 in a plan view. In such a configuration, a gas supplied near the wafers 200 in the process chamber 201 through the gas supply holes 410a and 420a flows in a horizontal direction, that is, a direction parallel to the surfaces of the wafers 200, flows downward and may be exhausted through the exhaust pipe 231. A main gas flow in the process chamber 201 becomes a flow in a horizontal direction as described above.

A pressure sensor 245 serving as a pressure detector (pressure detecting unit) configured to detect a pressure in the process chamber 201, an auto pressure controller (APC) valve 243 serving as a pressure regulator (pressure regulating unit) configured to control the pressure in the process chamber 201 and a vacuum pump 246 serving as a vacuum exhaust device are sequentially connected from an upstream end to the exhaust pipe 231. The APC valve 243 is configured to perform vacuum-exhaust or vacuum-exhaust stop in the process chamber 201 by opening and closing the valve while the vacuum pump 246 operates, and adjust a pressure in the process chamber 201 by adjusting a degree of valve opening based on information on the pressure detected by the pressure sensor 245 while the vacuum pump 246 operates. The APC valve 243 is a portion of an exhaust flow path of the exhaust system and serves as an exhaust flow path opening and closing unit that can close or seal the exhaust flow path of the exhaust system, that is, an exhaust valve, as well as a pressure regulating unit. Also, a trap device for capturing byproducts in an exhaust gas, an unreacted source gas or the like or a detoxifying device for abating corrosive components or toxic components in the exhaust gas may be connected to the exhaust pipe 231. An exhaust system, that is, an exhaust line mainly includes the exhaust pipe 231, the APC valve 243 and the pressure sensor 245. Also, the vacuum pump 246 may be included in the exhaust system. Also, the trap device or the detoxifying device may be included in the exhaust system.

A temperature sensor 263 serving as a temperature detecting unit is installed in the reaction tube 203 and is configured to set a temperature in the process chamber 201 to be a desired temperature distribution based on information on the temperature detected by the temperature sensor 263 by adjusting power supply to the heater 207. The temperature sensor 263 is configured to as an L-shape and is installed along the inner wall of the reaction tube 203, similar to the nozzles 410 and 420.

(2) Configuration of Processing Furnace in Substrate Processing Apparatus 600

Figure 4:
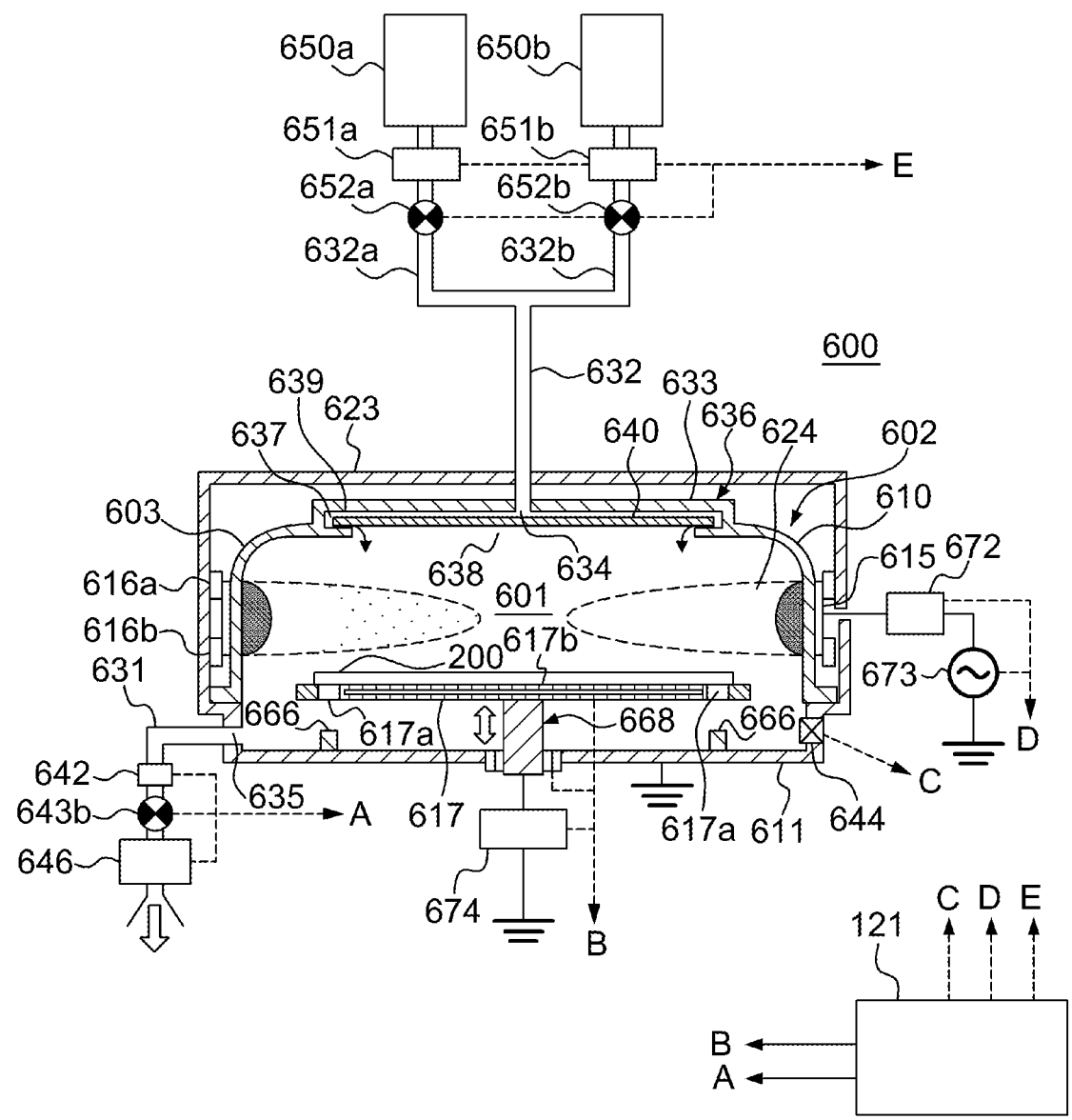
FIG. 4 is a configuration diagram schematically illustrating a processing furnace of a substrate processing apparatus preferably used in the substrate processing system of FIG. 1 for performing a plasma post treatment on a substrate on which a conductive thin film is formed.

Next, the substrate processing apparatus 600 will be described with reference to FIG. 4. The substrate processing apparatus 600 is configured as a modified magnetron typed (MMT) apparatus. The MMT apparatus is, for example, an apparatus for performing plasma treatment on the wafer 200 serving as the substrate using an MMT plasma source capable of generating high density plasma by an electric field and a magnetic field.

The MMT apparatus 600 includes a processing furnace 602 for performing plasma treatment on the wafer 200. The processing furnace 602 includes a process container 603 constituting a process chamber 601, a susceptor 617, a gate valve 644, a shower head 636, a gas exhaust port 635, a tubular electrode 615, an upper magnet 616a, a lower magnet 616b and a controller 121. The controller 121 is the same as the controller 121 of the substrate processing apparatus 100.

The process container 603 constituting the process chamber 601 includes a dome-shaped upper container 610 serving as a first container and a bowl-shaped lower container 611 serving as a second container. With the lower container 611 covered with the upper container 610, the process chamber 601 is formed. The upper container 610 is formed of, for example, a non-metallic material such as aluminum oxide ($Al_2O_3$), quartz ($SiO_2$) or the like and the lower container 611 is formed of, for example, aluminum (Al).

The susceptor 617 configured to support the wafer 200 is disposed at the center of the bottom of the process chamber 601. The susceptor 617 is formed of, for example, a non-metallic material such as aluminum nitride (AlN), ceramics, quartz or the like to reduce metal contamination of a film formed on the wafer 200.

A heater 617b serving as a heating mechanism is integrally embedded in the susceptor 617 and is configured to heat the wafer 200. When power is supplied to the heater 617b, the surface of the wafer 200 is heated to a temperature, for example, in a range of about 200° C. to 750° C.

A substrate support mainly includes the susceptor 617 and the heater 617b.

The susceptor 617 is electrically insulated from the lower container 611. A second electrode (not illustrated) serving as an electrode that changes impedance is installed in the susceptor 617. The second electrode is installed through an impedance variable mechanism 674. The impedance variable mechanism 674 is configured to control the potential of the wafer 200 through the second electrode (not illustrated) and the susceptor 617 by providing a coil and a variable capacitor and controlling the number of patterns of the coil or the capacitance of the variable capacitor.

A susceptor lifting mechanism 668 configured to lift the susceptor 617 is installed in the susceptor 617. Through holes 617a are installed in the susceptor 617. Wafer lifting pins 666 configured to lift the wafer 200 are installed on a bottom surface of the above-described lower container 611 at at least three positions. The through holes 617a and the wafer lifting pins 666 are disposed to pass through the through holes 617a in a state in which the wafer lifting pins 666 are not in contact with the susceptor 617 when the susceptor 617 is lowered by the susceptor lifting mechanism 668.

The gate valve 644 serving as a gate valve is installed at a side wall of the lower container 611. While the gate valve 644 is open, the wafer 200 may be loaded into the process chamber 601 or unloaded to the outside of the process chamber 601 using the transfer mechanism 702 in the transfer chamber 700. When the gate valve 644 is closed, the inside of the process chamber 601 may be airtightly sealed.

The shower head 636 configured to supply a gas into the process chamber 601 is installed in an upper portion of the process chamber 601. The shower head 636 includes a cap-shaped object 633, a gas inlet 634, a buffer chamber 637, an opening 638, a shielding plate 640 and a gas outlet 639.

A downstream end of the gas supply pipe 632 configured to supply a gas into the buffer chamber 637 is connected to the gas inlet 634. The buffer chamber 637 serves as a distribution space that distributes a gas introduced through the gas inlet 634.

For example, a downstream end of a gas supply pipe 632a configured to supply $N_2$ gas serving as a nitrogen-containing gas and a downstream end of a gas supply pipe 632b configured to supply $H_2$ gas serving as a hydrogen-containing gas are connected to an upstream side of the gas supply pipe 632 so as to be converged. Also, the $N_2$ gas may be referred to as a second reaction gas, the $H_2$ gas may be referred to as a third reaction gas, and a mixed gas of the $N_2$ gas and the $H_2$ gas may be referred to as a fourth reaction gas. Also, in order for the $H_2$ gas to mainly serve as a reducing agent, the $H_2$ gas may be referred to as a reducing agent, a reducing gas or a modifying gas. Since the $N_2$ gas mainly serves as a nitriding agent, the $N_2$ gas may be referred to as a nitriding agent, a nitriding gas or a modifying gas. The mixed gas of the $N_2$ gas and the $H_2$ gas may be referred to as a reducing agent, a reducing gas, a nitriding agent, a nitriding gas or a modifying gas.

A nitrogen gas bombe 650a, an MFC 651a serving as a flow rate control device and a valve 652a serving as an opening and closing valve are sequentially connected from an upstream end to the gas supply pipe 632a. A hydrogen gas bombe 650b, an MFC 651b and a valve 652b serving as an opening and closing valve are sequentially connected from an upstream end to the gas supply pipe 632b.

A gas supply system mainly includes the gas supply pipe 632, the gas supply pipe 632a, the gas supply pipe 632b, the MFCs 651a and 651b and the valves 652a and 652b. Also, the nitrogen gas bombe 650a and the hydrogen gas bombe 650b may be included in the gas supply system.

When the second reaction gas flows through the gas supply pipe 632a, a second reaction gas supply system mainly includes the gas supply pipe 632a, the MFC 651a and the valve 652a. The nitrogen gas bombe 650a may be included in the second reaction gas supply system.

When the nitriding agent (nitrogen-containing gas) serving as a second reaction gas flows through the gas supply pipe 632a, a nitriding agent (nitrogen-containing gas) supply system mainly includes the gas supply pipe 632a, the MFC 651a and the valve 652a. The nitrogen gas bombe 650a may be included in the nitriding agent (nitrogen-containing gas) supply system. When the $N_2$ gas flows through the gas supply pipe 632a, an $N_2$ gas supply system mainly includes the gas supply pipe 632a, the MFC 651a and the valve 652a. The nitrogen gas bombe 650a may be included in the $N_2$ gas supply system. The $N_2$ gas supply system may be referred to as an $N_2$ supply system.

When the third reaction gas flows through the gas supply pipe 632b, a third reaction gas supply system mainly includes the gas supply pipe 632b, the MFC 651b and the valve 652b. The hydrogen gas bombe 650b may be included in the third reaction gas supply system.

When the reducing agent (hydrogen-containing gas) serving as the third reaction gas flows through the gas supply pipe 632b, a reducing agent (hydrogen-containing gas) supply system mainly includes the gas supply pipe 632b, the MFC 651b and the valve 652b. The hydrogen gas bombe 650b may be included in the reducing agent (hydrogen-containing gas) supply system. When the $H_2$ gas flows through the gas supply pipe 632b, a $H_2$ gas supply system mainly includes the gas supply pipe 632b, the MFC 651b and the valve 652b. The hydrogen gas bombe 650b may be included in the $H_2$ gas supply system. The $H_2$ gas supply system may be referred to as a $H_2$ supply system.

The gas supply pipe 632, the gas supply pipe 632a and the gas supply pipe 632b are made of a non-metallic material such as quartz, aluminum oxide or the like or a metallic material such as SUS or the like. The $N_2$ gas and the $H_2$ gas may be freely supplied into the process chamber 601 through the buffer chamber 637 while opening and closing the valves 652a and 652b to control flow rates by the MFCs 651a and 651b.

The gas exhaust port 635 configured to exhaust the second reaction gas, the third reaction gas and the like from the process chamber 601 is installed in a lower portion of the side wall of the lower container 611. An upstream end of the gas exhaust tube 631 configured to exhaust a gas is connected to the gas exhaust port 635. An APC 642 serving as a pressure regulator, a valve 643b serving as an opening and closing valve, a vacuum pump 646 serving as an exhaust device are sequentially installed from an upstream end in the gas exhaust tube 631. A gas exhaust unit mainly includes the gas exhaust port 635, the gas exhaust tube 631, the APC 642 and the valve 643b. Also, the vacuum pump 646 may be included in the gas exhaust unit. When the vacuum pump 646 operates and the valve 643b is open, the inside of the process chamber 601 may be exhausted. Also, a pressure value in the process chamber 601 may be adjusted by adjusting a degree of opening of the APC 642.

The tubular electrode 615 is installed in an outer circumference of the process container 603 [the upper container 610] to surround a plasma generating region 624 in the process chamber 601. The tubular electrode 615 is formed in a tubular shape, for example, in a cylindrical shape. The tubular electrode 615 is connected to a high frequency power source 673 configured to generate high frequency power through a matching unit 672 configured to perform impedance matching. The tubular electrode 615 excites a gas supplied into the process chamber 601 and serves as a discharging mechanism (a plasma generating mechanism, a plasma creating mechanism or an activation mechanism) configured to generate plasma.

The upper magnet 616a and the lower magnet 616b are respectively installed at upper and lower ends of an outer surface of the tubular electrode 615. Each of the upper magnet 616a and the lower magnet 616b is configured as a permanent magnet formed in a tubular shape, for example, in a ring shape.

In the upper magnet 616a and the lower magnet 616b, both ends (i.e., inner and outer ends of each magnet) along a redial direction of the process chamber 601 include magnetic poles. A magnetic pole of the upper magnet 616a is disposed in a direction opposite that of the lower magnet 616b. That is, magnetic poles of inner peripheral portions of the upper magnet 616a and the lower magnet 616b have different polarities. Thus, a magnetic force line in a cylindrical axial direction is formed along an inner surface of the tubular electrode 615.

A plasma generating unit which is a plasma generating mechanism mainly includes the tubular electrode 615, the matching unit 672, the upper magnet 616a and the lower magnet 616b. Also, the high frequency power source 673 may be included in the plasma generating unit. After the mixed gas of the $N_2$ gas and the $H_2$ gas is introduced into the process chamber 601, a high frequency power is supplied to the tubular electrode 615 to form an electric field and a magnetron discharge plasma is generated in the process chamber 601 by forming a magnetic field using the upper magnet 616a and the lower magnet 616b. In this case, when the discharged electrons orbit the above-described electromagnetic field, ionization production rate of the plasma is increased and plasma having a long lifetime and a high density may be generated.

Also, a metal shield plate 623 configured to efficiently shield electromagnetic field is installed in the vicinity of the tubular electrode 615, the upper magnet 616a and the lower magnet 616b, so that the electromagnetic field formed by them does not adversely influence the external environment or the device such as another processing furnace.

Figure 5:
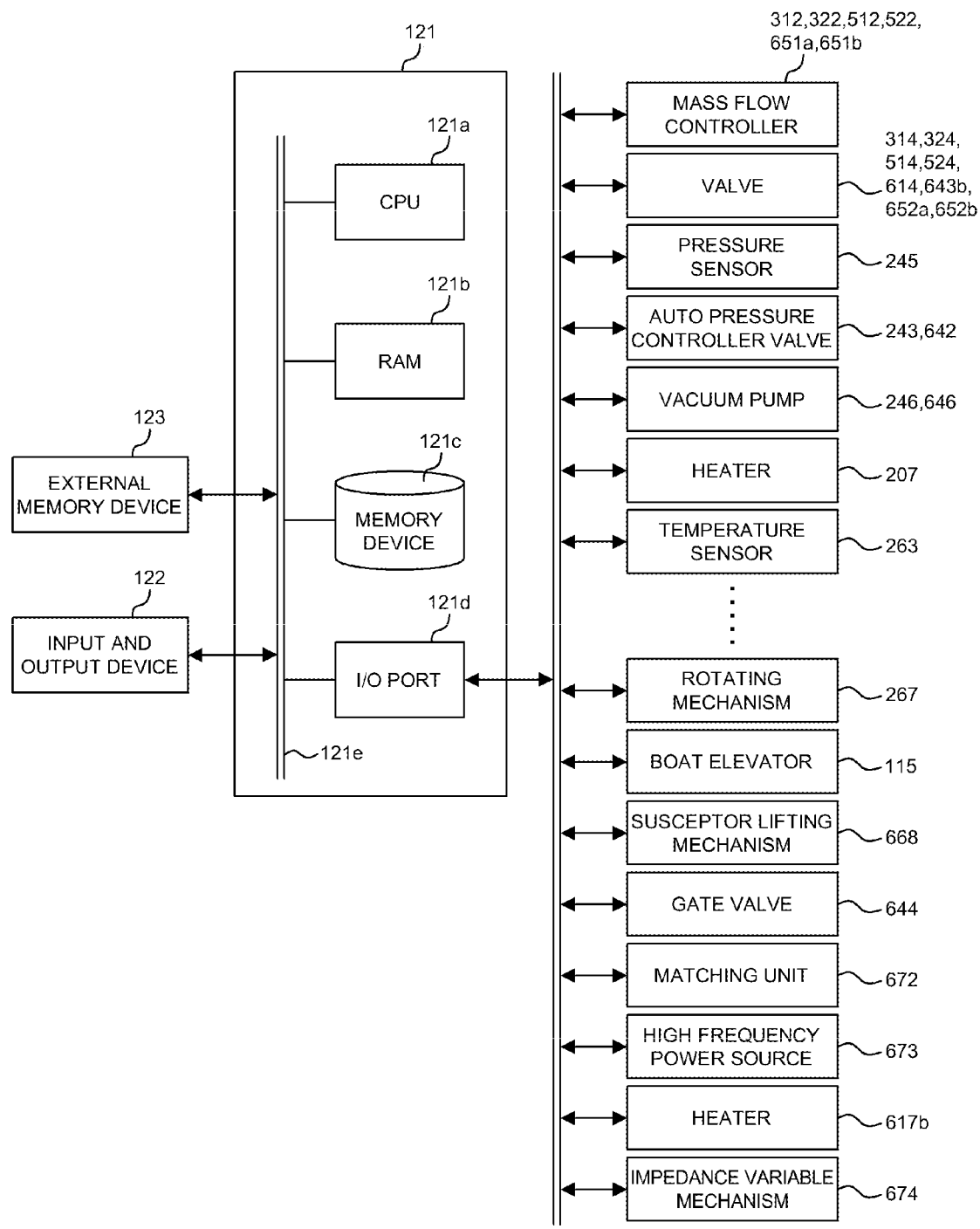
FIG. 5 is a block diagram illustrating a configuration of a controller of the substrate processing system illustrated in FIG. 1.

As illustrated in FIG. 5, a controller 121 serving as a control unit (control device) is configured as a computer that includes a central processing unit (CPU) 121a, a random access memory (RAM) 121b, a memory device 121c and an input/output (I/O) port 121d. The RAM 121b, the memory device 121c and the I/O port 121d are configured to exchange data with the CPU 121a through an internal bus 121e. An I/O device 122 configured as a touch panel is connected to the controller 121.

The memory device 121c is configured as a flash memory, a hard disk drive (HDD) or the like. A control program for controlling the operations of the substrate processing apparatus, a process recipe for describing sequences or conditions of substrate processing (to be described below) and the like are readably stored in the memory device 121c. The process recipe, which is a combination of sequences, causes the controller 121 to execute each sequence in the substrate processing process to be described below in order to obtain a predetermined result, functions as a program. Hereinafter, such a process recipe, a control program and the like are collectively referred to simply as a "program." When the term "program" is used in this specification, it may refer to either or both of the process recipe and the control program. Also, the RAM 121b is configured as a memory area (work area) in which a program, data and the like read by the CPU 121a are temporarily stored.

The I/O port 121d is connected to the MFC 312, 322, 512, 522, 651a and 651b, the valves 314, 324, 514, 524, 614, 643b, 652a and 652b, the APC valves 243 and 642, the pressure sensor 245, the vacuum pumps 246 and 646, the heaters 207 and 617b, the temperature sensor 263, the rotating mechanism 267, the boat elevator 115, the susceptor lifting mechanism 668, the gate valve 644, the matching unit 672, the high frequency power source 673, the impedance varying mechanism 674 and the like to be described below.

The CPU 121a reads and executes the control program from the memory device 121c and reads the process recipe from the memory device 121c according to an input of a manipulating command from the I/O device 122. To comply with the read process recipe, the CPU 121a is configured to control a flow rate regulating operation of various types of gases by the MFC 312, 322, 512, 522, 651a and 651b, opening or closing operations of the valves 314, 324, 514, 524, 614, 643b, 652a and 652b, an open or close operation of the APC valve 243, a pressure adjusting operation by the APC valve 243 based on the pressure sensor 245, temperature regulating operations by the heaters 207 and 617b based on the temperature sensors 263 and 642, starting or stopping the vacuum pumps 246 and 646, a rotation and rotational speed regulating operation of the boat 217 by the rotating mechanism 267, a lifting operation of the boat 217 by the boat elevator 115, a lifting operation of the susceptor 617 by the susceptor lifting mechanism 668, an opening or closing operation of the gate valve 644, an impedance matching operation by the matching unit 672, an adjusting operation of an amount high frequency power supplied to the tubular electrode 615 by the high frequency power source 673, a control operation of the electric potential of the wafer 200 by the impedance varying mechanism 674 and the like.

The controller 121 is not limited to being configured as a dedicated computer but may be configured as a general-purpose computer. For example, the controller 121 according to the present embodiment may be configured by preparing an external memory device 123 (for example, a magnetic tape, a magnetic disk such as a flexible disk and a hard disk, an optical disc such as a compact disc (CD) and a digital video disc (DVD), a magneto-optical disc such as an MO, and a semiconductor memory such as a Universal Serial Bus (USB) memory and a memory card) recording the above program, and then installing the program in the general-purpose computer using the external memory device 123. However, the method of supplying the program to the computer is not limited to supply through the external memory device 123. For example, a communication line such as the Internet or a dedicated line may be used to supply the program regardless the external memory device. The memory device 121c or the external memory device 123 is configured as a non-transitory computer-readable recording medium. Hereinafter, these are also collectively referred to simply as a recording medium. When the term "recording medium" is used in this specification, it refers to either or both of the memory device 121c and the external memory device 123.

(3) Substrate Processing Process

Next, the first embodiment, which is an example in which a conductive thin film constituting, for example, a gate electrode is formed on the wafer 200 and then a plasma treatment is performed on the wafer 200 on which the conductive thin film is formed as a process of a manufacturing processes of a semiconductor device using the substrate processing system 10 including the above-described substrate processing apparatuses 100 and 600, will be described with reference to FIG. 6. In the following description, operations of respective units constituting the substrate processing apparatuses 100 and 600 are controlled by the controller 121.

Preferably, in a film forming sequence (referred to simply as a sequence) of the present embodiment, a thin film (e.g., a TiN film) is formed on the wafer 200, a modifying gas including at least one of a nitriding agent (e.g., $N_2$ gas) and an oxidizing agent (e.g., $O_2$ gas) and a reducing agent (e.g., $H_2$ gas) is excited by plasma to supply the activated modifying gas to the formed TiN film, and the thin film is modified.

Preferably, a plurality of process gases (e.g., $TiCl_4$ gas and $NH_3$ gas) including elements (e.g., Ti or N) constituting a thin film (e.g., a TiN film) are supplied a predetermined number of times (n times) onto the wafer 200 in temporally separated pulses (in a non-simultaneous manner, asynchronously, intermittently or pulsewisely) to form a TiN film on the wafer 200, a modifying gas including at least one of a nitriding agent (e.g., $N_2$ gas) and an oxidizing agent (e.g., $O_2$ gas) and a reducing agent (e.g., $H_2$ gas) is excited by plasma to supply the activated modifying gas to the TiN film formed on the wafer 200, and the TiN film is modified.

Figure 6:
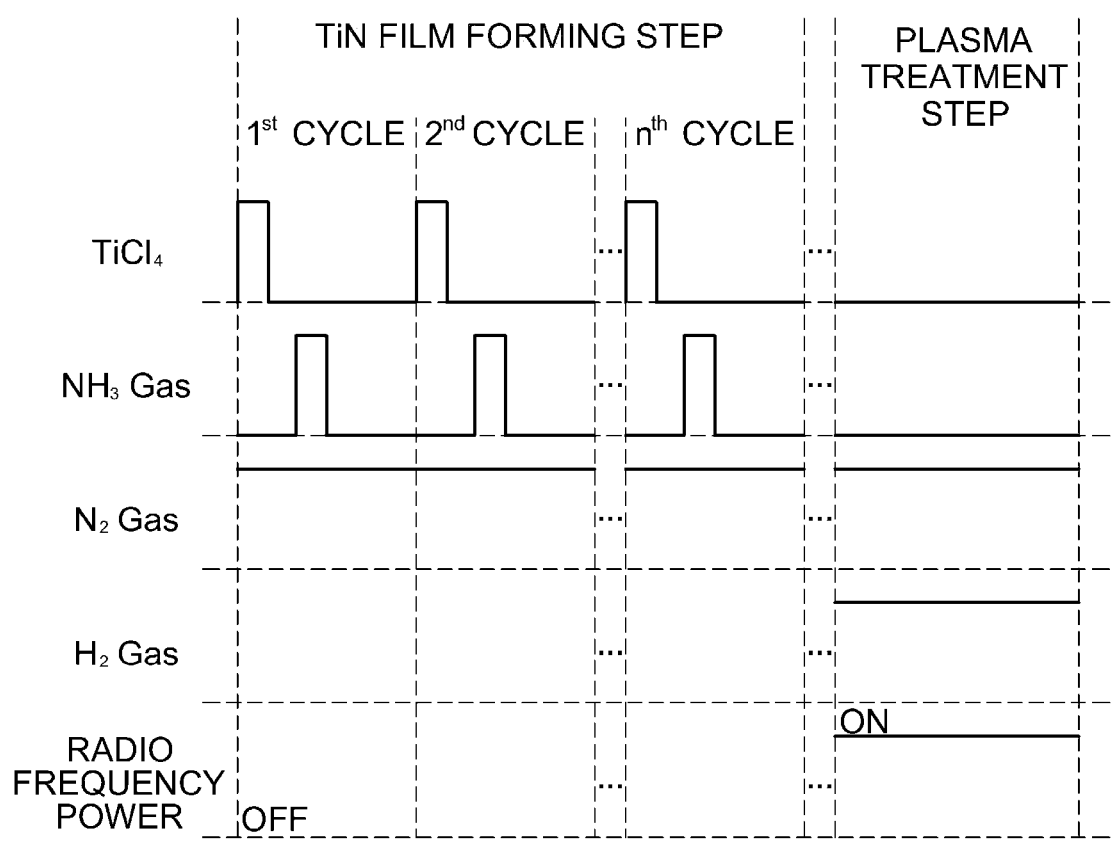
FIG. 6 is a time chart illustrating a film-forming sequence in the first embodiment of the present invention.

Specifically, as the sequence illustrated in FIG. 6, a titanium nitride (TiN) film containing Cl serving as an impurity (a TiN film containing an impurity) is formed by performing a cycle in which $TiCl_4$ gas and $NH_3$ gas flow sequentially in temporally separated pulses (in a non-simultaneous manner) a predetermined number of times (n times), a modifying gas including $H_2$ gas and $N_2$ gas (a mixed gas of $H_2$ gas and $N_2$ gas) is excited by plasma, activated to supply the activated modifying gas to the TiN film, and the TiN film containing an impurity is modified to have a low concentration impurity. Also, the sequence of forming the TiN film containing an impurity illustrated in FIG. 6 is represented as the following [Formula 2] for convenience of description. Also, in the following description, the same notation is used for convenience of description.

$(TiCl_4 \rightarrow NH_3) \times n \Rightarrow TiN$      [Formula 2]

When the term "processing (referred to as a process, a cycle, a step or the like) is performed a predetermined number of times" is used in this specification, it means that the process is performed once or multiple times. That is, it means that the process is performed once or more. FIG. 6 illustrates an example in which each process (cycle) is repeated n times. The number of times for performing each process is appropriately selected according to a film thickness required by the TiN film to be finally formed. That is, the above-described number of times for performing each process is determined according to a desired film thickness.

Also, when the term "in temporally separated pulses" or "in a non-simultaneous manner" is used in this specification, it refers to time separation. For example, when it is described in this specification that each processing is performed "in temporally separated pulses" (or "in a non-simultaneous manner"), it means that each process is asynchronously performed, that is, is performed without synchronization. In other words, it means that each process is intermittently (pulsewisely) and alternately performed. That is, it means that the supplied process gases in each process are supplied so as not to mix with each other. When each process is performed multiple times, the supplied process gases in each process are alternately supplied so as not to mix with each other.

When the term "wafer" is used in this specification, it refers to "the wafer itself," or a "a laminate (aggregate) of a wafer and a predetermined layer, a film and the like formed on a surface thereof," that is, the wafer refers to a wafer including a predetermined layer, a film and the like formed on a surface thereof. In addition, when the term "a surface of the wafer" is used in this specification, it refers to "a surface (exposed surface) of the wafer itself" or "a surface of a predetermined layer, a film and the like formed on the wafer, that is, the outermost surface of the wafer laminate."

Therefore, when it is described in this specification that "a predetermined gas is supplied to the wafer," it means that "a predetermined gas is directly supplied to a surface (exposed surface) of the wafer itself" or "a predetermined gas is supplied to a layer, a film and the like formed on the wafer, that is, to the outermost surface of the wafer laminate." In addition, when it is described in this specification that "a predetermined layer (or film) is formed on the wafer," it means that "a predetermined layer (or film) is directly formed on a surface (exposed surface) of the wafer itself" or "a predetermined layer (or film) is formed on a layer, a film and the like formed on the wafer, that is, a predetermined layer (or film) is formed on the outermost surface of the wafer laminate."

Also, the term "substrate" used in this specification is the same as the term "wafer" used in this specification. Thus, the term "wafer" in the above description may be replaced with the term "substrate."

Also, when the term "metal film" is used in this specification, it refers to a film made of a conductive material containing a metal atom (referred to simply as a conductive film). The metal film includes a conductive metal nitride film, a conductive metal oxide film, a conductive metal oxynitride film, a conductive metal oxycarbide film, a conductive metal composition film, a conductive metal alloy film, a conductive metal silicide film, a conductive metal carbide film, a conductive metal carbonitride film, etc. Also, a TiN film is a conductive metal nitride film.

(Wafer Charging and Boat Loading)

Figure 2:
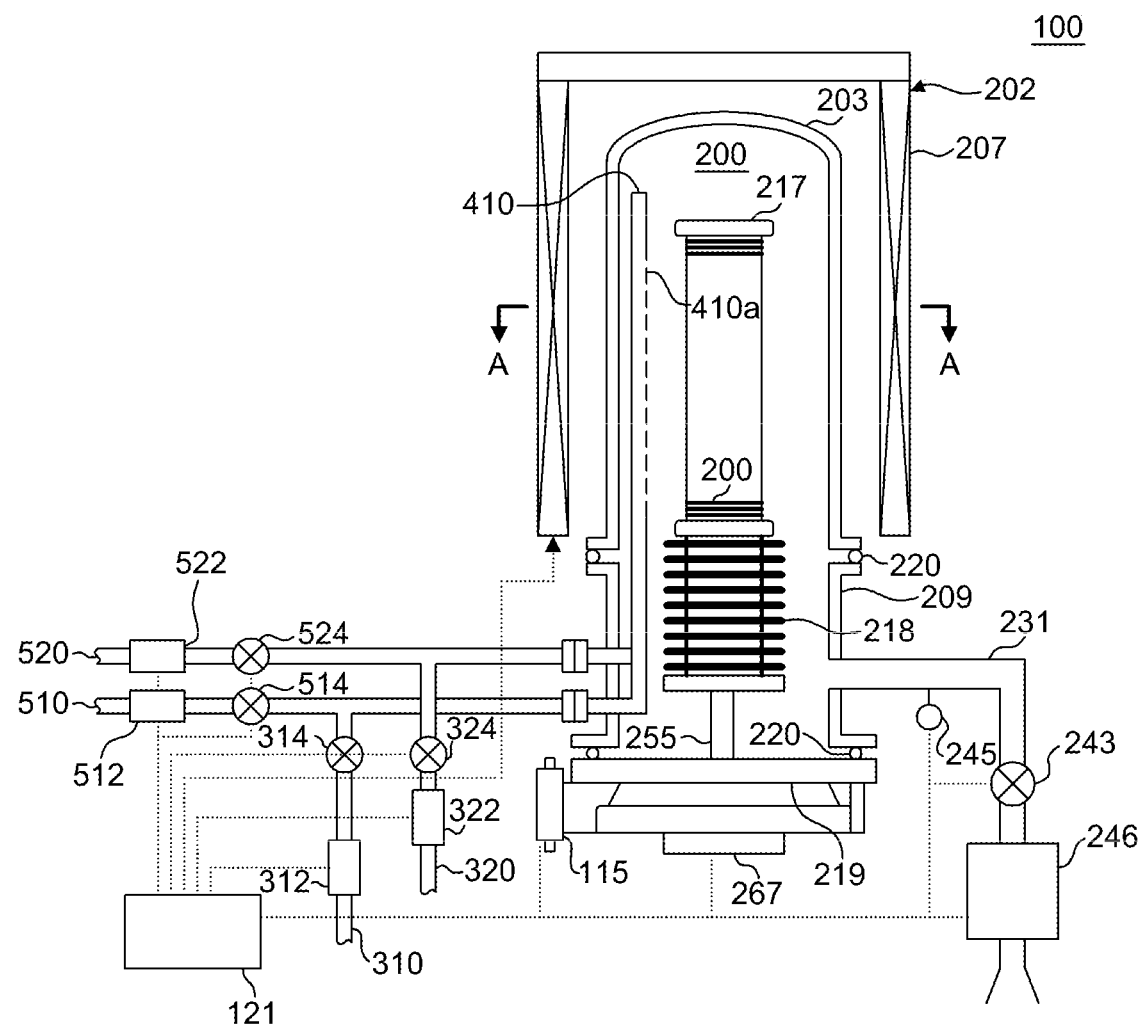
FIG. 2 is a configuration diagram schematically illustrating a processing furnace of a substrate processing apparatus preferably used in the substrate processing system of FIG. 1 for forming a conductive thin film on a substrate, and is a longitudinal sectional view illustrating the processing furnace.
Figure 3:
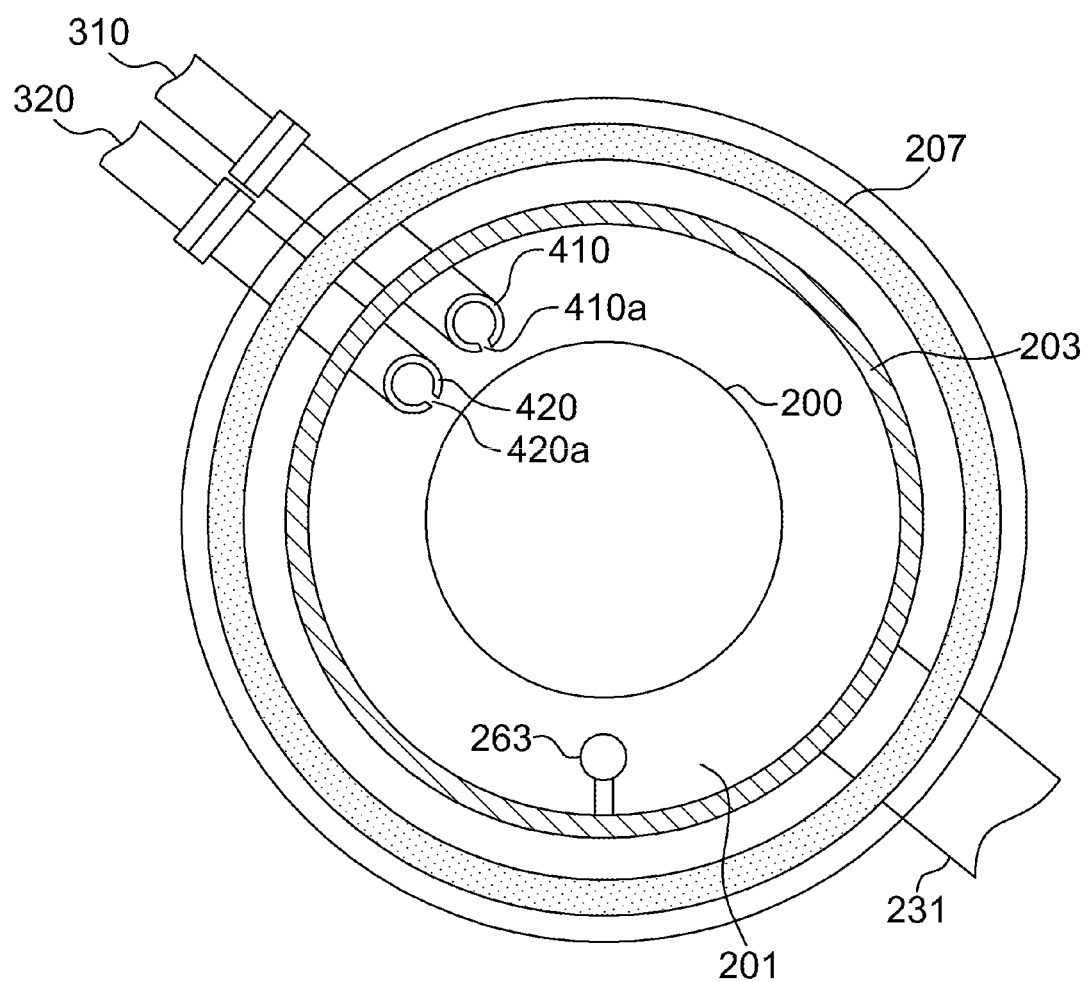
FIG. 3 is a schematic cross-sectional view taken along line A-A of FIG. 2.

When a plurality of wafers 200 are loaded onto the boat 217 (wafer charging), the boat 217 that supports the plurality of wafers 200 is lifted by the boat elevator 115 and loaded into the process chamber 201 (boat loading) as illustrated in FIG. 2. In this state, the seal cap 219 seals the lower opening of the manifold 209 through the O ring 220.

(Pressure Adjusting and Temperature Adjusting)

The process chamber 201 is vacuum-exhausted by the vacuum pump 246 such that the pressure in the process chamber 201 reaches a desired pressure (a degree of vacuum). In this case, the pressure in the process chamber 201 is measured by the pressure sensor 245, and the APC valve 243 is feedback controlled based on information on the measured pressure (pressure adjusting). The vacuum pump 246 is continuously operated at least until a process of the wafer 200 is completed. Also, the wafer 200 in the process chamber 201 is heated to a desired temperature by the heater 207. In this case, power supply to the heater 207 is feedback controlled based on information on the temperature detected by the temperature sensor 263 such that an inside of the process chamber 201 has a desired temperature distribution (temperature adjusting). Also, the heating of the inside of the process chamber 201 by the heater 207 is continuously performed at least until a process of the wafer 200 is completed. Next, the rotating mechanism 267 begins to rotate the boat 217 and the wafer 200. Also, the rotation of the boat 217 and the wafer 200 by the rotating mechanism 267 is continuously performed at least until a process of the wafer 200 is completed.

(Step of Forming TiN Film)

Next, a step of forming a TiN film will be described. The step of forming the TiN film includes a step of supplying $TiCl_4$ gas, a step of removing residual gas, a step of supplying $NH_3$ gas and a step of removing residual gas to be described below.

(Step of Supplying $TiCl_4$ Gas)

The valve 314 is open to flow $TiCl_4$ gas into the gas supply pipe 310. The $TiCl_4$ gas flowing into the gas supply pipe 310, whose flow rate is adjusted by the MFC 312, is supplied into the process chamber 201 through the gas supply hole 410a of the nozzle 410 and exhausted through the exhaust pipe 231.

In this case, the $TiCl_4$ gas is supplied onto the wafer 200. That is, the surface of the wafer 200 is exposed by the $TiCl_4$ gas. In this case, at the same time, the valve 514 is open to flow $N_2$ gas into the carrier gas supply pipe 510. The $N_2$ gas flowing into the carrier gas supply pipe 510, whose flow rate is adjusted by the MFC 512, is supplied into the process chamber 201 with the $TiCl_4$ gas and exhausted through the exhaust pipe 231. In this case, in order to prevent the $TiCl_4$ gas from entering the nozzle 420, the valve 524 is open to flow the $N_2$ gas into the carrier gas supply pipe 520. The $N_2$ gas is supplied into the process chamber 201 through the gas supply pipe 320 and the nozzle 420 and exhausted through the exhaust pipe 231. Also, any one of the valves 514 and 524 is open and the $N_2$ gas may flow into any one of the carrier gas supply pipes 510 and 520.

The APC valve 243 is appropriately adjusted, and the pressure in the process chamber 201 is set to, for example, a pressure in a range of 1 Pa to 1000 Pa, and preferably in a range of 1 Pa to 100 Pa, for example, in a range of 20 Pa to 50 Pa. When the pressure is higher than 1000 Pa, removing residual gas to be described below may not be sufficient. In this case, Cl serving as an impurity is added to the TiN film, and thus resistivity may be increased. Also, when the pressure is lower than 1 Pa, a sufficient reaction rate of the $TiCl_4$ gas may not be obtained. A supply flow rate of the $TiCl_4$ gas controlled by the MFC 312 is set to, for example, a flow rate in a range of 0.001 slm to 2 slm, and preferably 0.002 slm to 1 slm, for example, 0.007 slm. A supply flow rate of the $N_2$ gas controlled by the MFCs 512 and 522 is set to, for example, a flow rate in a range of 0.2 slm to 20 slm, and preferably 0.4 slm to 15 slm, for example, 0.46 slm. A time for which the $TiCl_4$ gas is supplied to the wafer 200, that is, a gas supply time (radiation time) is set to, for example, a time in a range of 0.01 second to 60 seconds, and preferably in a range of 1 second to 30 seconds, for example, 2 seconds. In this case, a temperature of the heater 207 is set such that a temperature of the wafer 200 is set to, for example, a temperature in a range of 200° C. to 500° C., and preferably in a range of 250° C. to 400° C., for example, 300° C. At a temperature of 500° C. or more, since the thermal decomposition of the titanium-containing gas is facilitated, a film forming rate is excessively increased, the controllability of the film thickness is degraded, film thickness uniformity is degraded or a large amount of impurities is added thereto, and thus resistivity may be increased. Meanwhile, reactivity is reduced at a temperature of less than 200° C., and thus the film forming may be difficult. When the $TiCl_4$ gas is supplied to the wafer 200, a Ti layer containing an impurity (Cl) having a thickness in a range of about one atomic layer to several atomic layers is formed on, for example, an outermost surface of the wafer 200 (an underlying film of the surface).

The Ti layer containing an impurity may be a Ti layer, a titanium-containing layer containing an impurity, an adsorption layer of $TiCl_4$ and a composition layer including at least two thereof.

The Ti layer includes a discontinuous layer other than a continuous layer formed of Ti. That is, the Ti layer includes a Ti deposition layer having a thickness in a range of about one atomic layer to several atomic layers, which is formed of Ti.

The Ti layer containing an impurity generally refers to a continuous layer that is formed of Ti and contains Cl serving as impurities, a discontinuous layer or a Ti thin film that is formed by overlapping these layers and contains impurities. The Ti thin film containing an impurity may refer to a continuous layer that is formed of Ti and contains impurities. Ti forming the Ti layer containing an impurity includes Ti whose bond with impurities is not completely disconnected but bond with other impurities is completely disconnected.

The adsorption layer of $TiCl_4$ includes a continuous adsorption layer formed of $TiCl_4$ molecules and a discontinuous adsorption layer. That is, the adsorption layer of $TiCl_4$ includes an adsorption layer that is formed of $TiCl_4$ molecules and has a thickness of one molecular layer or less than one molecular layer. $TiCl_4$ molecules forming the adsorption layer of $TiCl_4$ include molecules in which some Ti—Cl bonds are partially disconnected. That is, the adsorption layer of $TiCl_4$ may include either or both of a physical adsorption layer of $TiCl_4$ and a chemical adsorption layer of $TiCl_4$.

Here, the term "layer having a thickness of less than one atomic layer" refers to a discontinuously formed atomic layer and the term "layer having a thickness of one atomic layer" refers to a continuously formed atomic layer. The term "layer having a thickness of less than one molecular layer" refers to a discontinuously formed molecular layer and the term "layer having a thickness of one molecular layer" refers to a continuously formed molecular layer. The titanium-containing layer containing an impurity may include both of the Ti layer and the adsorption layer of $TiCl_4$. However, the titanium-containing layer containing an impurity is represented using an expression such as "one atomic layer" or "several atomic layers."

(Step of Removing Residual Gas)

After the Ti layer containing an impurity is formed, the valve 314 is closed to stop supply of the $TiCl_4$ gas. In this case, while the APC valve 243 is open, the inside of the process chamber 201 is vacuum-exhausted by the vacuum pump 246, and an unreacted gas remaining in the process chamber 201 or $TiCl_4$ gas that has contributed to formation of the Ti layer containing an impurity is excluded from the inside of the process chamber 201. That is, an unreacted gas remaining in a space in which the wafer 200 on which the Ti layer containing an impurity is formed is present or the $TiCl_4$ gas that has contributed to formation of the Ti layer containing an impurity are removed. In this case, while the valves 514, 524 and 534 are open, supply of $N_2$ gas into the process chamber 201 continues. The $N_2$ gas serves as a purge gas. Therefore, it is possible to increase an effect of excluding an unreacted gas remaining in the process chamber 201 or the $TiCl_4$ gas that has contributed to formation of the Ti layer containing an impurity from the inside of the process chamber 201.

In this case, the residual gas may not be completely excluded from the process chamber 201 and the inside of the process chamber 201 may not be completely purged. When an amount of the gas remaining in the process chamber 201 is small, a step performed thereafter may not be negatively influenced by the residual gas. The flow rate of the $N_2$ gas supplied into the process chamber 201 does not need to be high. For example, the inside of the process chamber 201 may be purged by supplying an amount of $N_2$ gas that corresponds to the capacity of the reaction pipe 203 [the process chamber 201] without causing negative influence in the step thereafter. As described above, the inside of the process chamber 201 may not be completely purged to reduce a purging time, thereby improving the throughput. Also, unnecessary consumption of the $N_2$ gas may be suppressed.

(Step of Supplying $NH_3$ Gas)

After the residual gas in the process chamber 201 is removed, the valve 324 is open to flow $NH_3$ gas into the gas supply pipe 320. The $NH_3$ gas flowing into the gas supply pipe 320, whose flow rate is adjusted by the MFC 322, is supplied into the process chamber 201 through the gas supply hole 420a of the nozzle 420 and exhausted through the exhaust pipe 231. In this case, the $NH_3$ gas is supplied onto the wafer 200. That is, the surface of the wafer 200 is exposed by the $NH_3$ gas. In this case, at the same time, the valve 524 is open to flow $N_2$ gas into the carrier gas supply pipe 520. The $N_2$ gas flowing into the carrier gas supply pipe 520, whose flow rate is adjusted by the MFC 522, is supplied into the process chamber 201 with the $NH_3$ gas and exhausted through the exhaust pipe 231. In this case, in order to prevent the $NH_3$ gas from entering the nozzle 410, the valve 514 is open to flow $N_2$ gas into the carrier gas supply pipe 510. The $N_2$ gas is supplied into the process chamber 201 through the gas supply pipes 310 and 320 and the nozzle 410 and exhausted through the exhaust pipe 231.

When the $NH_3$ gas flows, the APC valve 243 is appropriately adjusted and a pressure in the process chamber 201 is set to, for example, a pressure in a range of 0.01 Pa to 70000 Pa, and preferably in a range of 0.01 Pa to 1330 Pa, for example, 50 Pa. When the pressure is lower than 0.01 Pa, a sufficient film-forming rate may not be obtained. A supply flow rate of the $NH_3$ gas controlled by the MFC 322 is set to, for example, a flow rate in a range of 0.1 slm to 20 slm, and preferably in a range of 0.3 slm to 10 slm, for example, 1 slm. As the supply flow rate of the $NH_3$ gas is increased, addition of the impurities derived from the source gas to the TiN film may be preferably reduced. Meanwhile, when the supply flow rate of the $NH_3$ gas is smaller than 0.1 slm, the $NH_3$ gas may not be sufficient to react with the source gas, the impurities remain, and thus the resistivity of the TiN film may be increased. A supply flow rate of the $N_2$ gas controlled by the MFCs 512 and 522 is set to, for example, a flow rate in a range of 0.2 slm to 20 slm, and preferably in a range of 0.4 slm to 15 slm, for example, 0.46 slm. A time for which the $NH_3$ gas is supplied onto the wafer 200, that is, a gas supply time (radiation time) is set to, for example, a time in a range of 0.001 second to 300 seconds, and preferably in a range of 0.005 second to 60 seconds, for example, 20 seconds. As the supply time for which the $NH_3$ gas is supplied is increased, the addition of the impurities derived from the source gas to the TiN film may be preferably reduced. Meanwhile, when the supply time for which the $NH_3$ gas is supplied is smaller than 0.001 second, the $NH_3$ gas is not sufficient to react with the source gas, the impurities remain, and thus the resistivity of the TiN film may be increased. In this case, the temperature of the heater 207 is set to the same temperature as that in the step of supplying the $TiCl_4$ gas.

In this case, the NH$_3$ gas is replaced and reacts with some of the Ti layer containing an impurity formed on the wafer 200 in the step of supplying the TiCl$_4$ gas (i.e., an adsorption site of a titanium-containing layer). Thus, a layer including Ti, N and impurities (hereinafter, referred to as a TiN layer containing an impurity or a TiN layer) is formed on the wafer 200.

(Step of Removing Residual Gas)

After the TiN layer containing an impurity is formed, the valve 324 is closed to stop supply of the NH$_3$ gas. In this case, while the APC valve 243 is open, the inside of the process chamber 201 is vacuum-exhausted by the vacuum pump 246, and an unreacted gas remaining in the process chamber 201 or NH$_3$ gas or byproducts that have contributed to the formation of the TiN layer containing an impurity is excluded from the inside of the process chamber 201. That is, an unreacted gas remaining in a space in which the wafer 200 on which the TiN layer containing an impurity is formed is present or the NH$_3$ gas that has contributed to the formation of the TiN layer containing an impurity are removed. In this case, while the valves 514 and 524 are open, supply of N$_2$ gas into the process chamber 201 continues. The N$_2$ gas serves as a purge gas. Therefore, it is possible to increase an effect of excluding an unreacted gas remaining in the process chamber 201 or the NH$_3$ gas or the byproducts that have contributed to the formation of the TiN layer containing an impurity from the inside of the process chamber 201.

In this case, in the same manner as in the step of removing residual gas after the step of supplying the TiCl$_4$ gas, the residual gas may not be completely excluded from the process chamber 201, and the inside of the process chamber 201 may not be completely purged.

(Performing a Predetermined Number of Times)

When a cycle in which the above-described step of supplying TiCl$_4$ gas, the step of removing residual gas, the step of supplying NH$_3$ gas and the step of removing residual gas are sequentially performed is performed once or more (a predetermined number of times), that is, when one cycle including the step of supplying TiCl$_4$ gas, the step of removing residual gas, the step of supplying NH$_3$ gas and the step of removing residual gas is performed only n times (where n is an integer of 1 or more), a TiN film containing an impurity having a predetermined thickness (e.g., range of 0.1 nm to 5 nm) is formed on the wafer 200. The above-described cycle is preferably repeated multiple times.

(Purging and Restoring to Atmospheric Pressure)

After the TiN film containing an impurity having a predetermined film thickness is formed, the valves 514 and 524 are open and N$_2$ gas is supplied into the process chamber 201 through the carrier gas supply pipes 510 and 520 and exhausted through the exhaust pipe 231. The N$_2$ gas serves as a purge gas. Therefore, the inside of the process chamber 201 is purged by an inert gas and a gas remaining in the process chamber 201 or byproducts are removed from the inside of the process chamber 201 (purge). Then, an atmosphere in the process chamber 201 is replaced with the inert gas (inert gas replacement) and the pressure in the process chamber 201 is restored to a normal pressure (restoration to an atmospheric pressure).

(Boat Unloading and Wafer Discharging)

The seal cap 219 is lowered by the boat elevator 115 and a lower end of the manifold 209 is open. Also, the processed wafer 200 is unloaded (boat unloading) to the outside of the process chamber 201 from the lower end of the manifold 209 while being held on the boat 217. The processed wafer 200 is extracted from the boat 217 (wafer discharge).

(Plasma Processing of TiN Film Containing an Impurity)

Next, after the wafer 200, on which the TiN film containing an impurity is formed in the sequence of the first embodiment using the substrate processing apparatus 600, is loaded into the substrate processing apparatus 600 via the transfer chamber 700, plasma treatment is performed on the wafer 200 on which the TiN film containing an impurity is formed in the substrate processing apparatus 600 (referred to as plasma post treatment or simply as post treatment).

(Wafer Charging)

First, the susceptor 617 is lowered to a transfer position for the wafer 200 and wafer lifting pins 666 pass through through holes 617a of the susceptor 617. As a result, the lifting pins 666 are in states protruding from the surface of the susceptor 617 at a predetermined height.

Next, the gate valve 644 is open, and the wafer 200 is loaded into the process chamber 601 using the transfer mechanism 702 in the transfer chamber 700. As a result, the wafer 200 is supported in a horizontal orientation on the wafer lifting pins 666 protruding from the surface of the susceptor 617. Also, a TiN film containing Cl is pre-formed on the wafer 200.

When the wafer 200 is loaded into the process chamber 601, the gate valve 644 is closed to seal the inside of the process chamber 601. Also, the susceptor 617 is lifted by the susceptor lifting mechanism 668. As a result, the wafer 200 is disposed on an upper surface of the susceptor 617. Then, the susceptor 617 is lifted to a predetermined position, and the wafer 200 is lifted to a predetermined processing position.

Also, when the wafer 200 is loaded into the process chamber 601, while the inside of the process chamber 601 is exhausted by the gas exhaust tube 631, N$_2$ gas serving as an inert gas is supplied into the process chamber 601 through the gas supply pipes 632 and 632a, the inside of the process chamber 601 is filled with the inert gas, and it is preferable to reduce the oxygen concentration. That is, when the vacuum pump 646 operates to open the valve 643b, while the inside of the process chamber 601 is exhausted, it is preferable that N$_2$ gas is supplied into the process chamber 601 through the buffer chamber 637 by opening the valve 652a.

[Step of Plasma Treatment (Post Treatment)]

The wafer 200 is heated by supplying power to the heater 617b embedded in the susceptor 617. The temperature of the wafer 200 is set to a predetermined temperature in a range of 300° C. to 400° C. Then, the valves 652a and 652b are open to introduce (supply) a mixed gas of N$_2$ gas and H$_2$ gas into the process chamber 601 through the buffer chamber 637. In this case, degrees of opening of the MFCs 651a and 651b are adjusted so that flow rates of the N$_2$ gas and H$_2$ gas included in the mixed gas are set to predetermined flow rates. The flow rate of the N$_2$ gas supplied into the process chamber 601 is set to a predetermined flow rate in a range of 0.01 slm to 1 slm, and preferably in a range of 0.1 slm to 0.5 slm, for example, 0.3 slm. The flow rate of the H$_2$ gas supplied into the process chamber 601 is set to a predetermined flow rate in a range of 0.01 slm to 1 slm, and preferably in a range of 0.1 slm to 0.5 slm, for example, 0.3 slm. Also, a ratio of the N$_2$ gas and the H$_2$ gas is set to a predetermined ratio of from 1:10 to 10:1, and preferably from 1:5 to 5:1, for example, 1:1.

After the introduction of the mixed gas into the process chamber 601 is started, the pressure in the process chamber 601 is adjusted to a predetermined pressure in a range of 1 Pa to 260 Pa using the vacuum pump 646 and the APC 642, and preferably, in a range of 10 Pa to 100 Pa, for example, 20 Pa. In this case, when high frequency power is applied to the tubular electrode 615 from the high frequency power source 673 through the matching unit 672, magnetron discharge occurs in the process chamber 601 due to magnetic force applied by the upper magnet 616a and the lower magnet 616b and the high frequency power. As a result, high-density plasma is generated in the plasma generating region 624 above the wafer 200. Also, power (radio frequency (RF) power) applied to the tubular electrode 615 is set to, for example, predetermined power in a range of 10 W to 1000 W, and preferably in a range of 40 W to 1000 W, for example, 700 W. In this case, the impedance varying mechanism 674 is controlled in advanced to be a desired impedance value. Also, a self bias is set to, for example, a predetermined value in a range of 10 V to 700 V, and preferably in a range of 30 V to 600 V, for example, 435V.

The plasma treatment time of the wafer 200 on which the TiN film containing an impurity is formed is set to a predetermined time on a range of 30 seconds to 240 seconds, and preferably in a range of 60 seconds to 240 seconds, for example, 240 seconds. When the plasma treatment is completed, the supply of power to the tubular-shaped electrode 215 is stopped.

(Step of Removing Residual Gas)

Next, the valves 652a and 652b are closed to stop supply of the $N_2$ gas and the $H_2$ gas into the process chamber 201. When the plasma treatment is performed, the supply of power to the tubular-shaped electrode 215 is stopped, and the valves 652a and 652b are closed. Also, the residual gas in the process chamber 201 is exhausted using the gas exhaust pipe 231.

(Stopping Heating, Purging and Restoring to an Atmospheric Pressure)

Then, when the valve 652a is open, $N_2$ gas is supplied into the process chamber 601 through the buffer chamber 637, and when the $N_2$ gas is exhausted through the gas exhaust tube 631, the inside of the process chamber 601 is purged by the $N_2$ gas [Purging gas]. Then, an atmosphere in the process chamber 601 is replaced with the $N_2$ gas ($N_2$ gas replacement) and the pressure in the process chamber 601 is restored to a normal pressure (restoration to an atmospheric pressure).

(Wafer Discharging)

Then, the susceptor 617 is lowered to the transfer position of the wafer 200 and the wafer 200 is supported by the wafer lifting pins 666 protruding from the surface of the susceptor 617. Also, the gate valve 644 is open, and the wafer 200 is unloaded to the outside of the process chamber 601 using the transfer mechanism 702 (wafer discharge).

In the step of plasma treatment, plasma is generated in atmospheres of $H_2$ gas serving as a reducing gas and $N_2$ gas serving as a nitriding gas, and the TiN film containing an impurity is exposed to the plasma (referred to as $H_2+N_2$ plasma). Then, H active species generated by exciting $H_2$ gas to plasma bond with Cl which is impurities in the TiN film, become HCl, $CH_3$, $NH_4Cl$ or the like, and is removed from the TiN film. By such a reduction reaction, Cl which is an impurity is removed from the TiN film containing Cl, and thus the TiN film having a low Cl concentration is formed. Also, N active species generated by exciting $N_2$ gas to a plasma is added to the TiN film from which the impurities is removed by the reduction reaction, the N active species has high energy, and the energy facilitates the crystallization of the TiN film. Resistivity is lowered by the crystallization of the TiN film.

Also, it is possible to tune the resistivity of the TiN film by a change in the plasma treatment time. That is, as the processing time is increased, a concentration of an impurity is decreased, the crystallization of the TiN film proceeds, and thus resistivity is lowered.

Also, as the self bias is increased, the concentration of the impurity is decreased, the crystallization of the TiN film proceeds, and thus the resistivity is lowered. In this manner, it is possible to tune the resistivity of the TiN film by adjusting a value of the self bias. Also, when the self bias is increased, since an N ion in the plasma is further facilitated and has a high energy and reaches the TiN film, it is thought that N is easy to bond with Ti and the N concentration in the film is increased. When a lot of N having high electronegativity is added to the film, it is thought that the work function is increased. In this manner, the N concentration is controlled by adjusting the value of the self bias, and thus it is possible to tune the work function.

Also, an example in which the step of plasma treatment is performed once is described above, but the present invention is not limited thereto. For example, the step of plasma treatment is performed multiple times (a plurality of cycles). Specifically, a cycle includes the step of plasma treatment and the step of removing residual gas, the step of plasma treatment and the step of removing residual gas are alternately repeated a predetermined number of times (n cycles). Thus, it is possible to control the plasma treatment time by the number of cycles. Also, when the step of plasma treatment is performed a plurality of cycles, the plasma treatment time may be changed for each cycle, and the self bias may be changed for each cycle.

Also, in the above-described step of plasma treatment, an example in which the $N_2$ gas and the $H_2$ gas are simultaneously supplied into the process chamber 601 and the supply into the process chamber 601 is simultaneously stopped is described above, but the present invention is not limited thereto. For example, the $H_2$ gas flows first, the $H_2$ gas only flows for a predetermined time, and then the $N_2$ gas may flow. When the $H_2$ gas flows first, since a predetermined amount of impurities are removed from the TiN film by the reducing action of H active species and then N active species are added to a portion from which the impurities are removed, reducing and nitridation may be performed more efficiently. Also, while the $N_2$ gas flows, the supply of the $H_2$ gas is stopped, and the supply of the $N_2$ gas may be stopped after a predetermined time has elapsed. When the $N_2$ gas only is supplied after the supply of the $H_2$ gas is stopped, since it is facilitated for the N active species to be added to the portion from which the impurities are removed, nitridation may be performed more efficiently. Also, there is no need to simultaneously flow the $N_2$ gas and the $H_2$ gas. For example, the $N_2$ gas and the $H_2$ gas may flow in temporally separated pulses (in a non-simultaneous manner, asynchronously, intermittently or pulsewisely), so that the $H_2$ gas is supplied and stopped and then the $N_2$ gas is supplied and stopped. In this manner, the reducing and nitridation of the TiN film may be performed more efficiently.

Also, in the above-described step of plasma treatment, an example in which $N_2$ gas serving as a nitriding agent and $H_2$ gas serving as a reducing agent flow is described, but the present invention is not limited thereto. $O_2$ gas serving as an oxidizing agent and $H_2$ gas serving as a reducing agent may flow or $N_2$ gas serving as a nitriding agent, $O_2$ gas serving as an oxidizing agent and $H_2$ gas serving as a reducing agent may flow. Also, when the step of plasma treatment is performed multiple times (a plurality of cycles), the combination of the flowing gases may be changed in the middle of the step or for each determined number of cycles. For example, the resistance of the TiN film is lowered by flowing $N_2$ gas serving as a nitriding agent and $H_2$ gas serving as a reducing agent flow for the determined number of cycles, and then the work function may be modified by flowing $O_2$ gas serving as an oxidizing agent and $H_2$ gas serving as a reducing agent.

<Modification 1>

In Modification 1, the TiN film is formed by Formula 3 using tetrakis(diethylamido)titanium ($Ti[N (CH_2CH_3)_2]_4$, abbreviated to: TDEAT) which is an organic source gas containing a titanium-containing source including titanium (Ti) which is a metal element serving as a first element, as a source gas. Since the step of supplying TDEAT gas is performed in place of the step of supplying $TiCl_4$ gas in the above-described first embodiment and carbon (C) or hydrogen (H) is used as an added element serving as an impurity in place of Cl, a difference therebetween will be described below. Since processing sequences and processing conditions in each step are substantially the same as those in the above-described first embodiment, a detailed description thereof is omitted.

 [Formula 3]

(Step of Supplying TDEAT Gas)

The valve 314 is open to flow TDEAT gas into the gas supply pipe 310. The TDEAT gas flowing into the gas supply pipe 310, whose flow rate is adjusted by the MFC 312, is supplied into the process chamber 201 through the gas supply hole 410a of the nozzle 410 and exhausted through the exhaust pipe 231.

In this case, the TDEAT gas is supplied to the wafer 200. That is, the surface of the wafer 200 is exposed by the TDEAT gas. In this case, at the same time, the valve 514 is open to flow $N_2$ gas into the carrier gas supply pipe 510. The $N_2$ gas flowing into the carrier gas supply pipe 510, whose flow rate is adjusted by the MFC 512, is supplied into the process chamber 201 with the TDEAT gas and exhausted through the exhaust pipe 231. In this case, in order to prevent the TDEAT gas from being penetrated into the nozzle 420, the valve 524 is open to flow $N_2$ gas into the carrier gas supply pipe 520. The $N_2$ gas is supplied to the process chamber 201 through the gas supply pipe 320 and the nozzle 420 and exhausted through the exhaust pipe 231. Also, any one of the valves 514 and 524 is open and the $N_2$ gas may flow into any one of the carrier gas supply pipes 510 and 520.

The APC valve 243 is appropriately adjusted and the pressure in the process chamber 201 is set to, for example, a pressure in a range of 1 Pa to 1000 Pa, and preferably in a range of 1 Pa to 500 Pa, for example, 50 Pa. When the pressure is higher than 1000 Pa, removing residual gas to be described below may not be sufficient. In this case, C or H serving as an impurity is added to the TiN film, and thus resistivity may be increased. Also, when the pressure is lower than 1 Pa, a sufficient reaction rate of the TDEAT gas may not be obtained. A supply flow rate of the TDEAT gas controlled by the MFC 312 is set to, for example, a flow rate in a range of 0.001 slm to 3 slm, and preferably in a range of 0.001 slm to 1 slm, for example, 0.0015 slm. A supply flow rate of the $N_2$ gas controlled by each of the MFCs 512 and 522 is set to, for example, a flow rate in a range of 0.2 slm to 20 slm, and preferably in a range of 0.4 slm to 15 slm, for example, 0.46 slm. A time for which the TDEAT gas is supplied onto the wafer 200, that is, a gas supply time (radiation time) is set to, for example, a time in a range of 0.2 second to 60 seconds, and preferably in a range of 0.5 second to 30 seconds, for example, 10 seconds. When the supply time of the TDEAT gas is greater than 60 seconds, a lot of C derived from the TDEAT gas is added to the TiN film, and thus the resistivity of the TiN film may be increased. Also, when the supply time of the TDEAT gas is smaller than 0.2 second, a film-forming rate may be decreased. In this case, the temperature of the heater 207 is set such that the temperature of the wafer 200 is set to, for example, a temperature in a range of 200° C. to 500° C., and preferably in a range of 250° C. to 400° C., for example, 300° C. At a temperature of 500° C. or more, since the thermal decomposition of the titanium-containing gas is facilitated, a film forming rate is excessively increased, the controllability of the film thickness is degraded, film thickness uniformity is degraded or a large amount of impurities is added thereto, and thus resistivity may be increased. Meanwhile, at a temperature of less than 200° C., reactivity is reduced, and thus the film formation may be difficult. The gas flowing in the process chamber 201 is only the TDEAT gas and the $N_2$ gas, and when the TDEAT gas is supplied onto the wafer 200, a Ti layer containing C or H serving as an impurity having a thickness in a range of about one atomic layer to several atomic layers is formed on, for example, an outermost surface of the wafer 200 (an underlying film of the surface).

When a cycle in which a step of supplying TDEAT gas, a step of removing residual gas, a step of supplying $NH_3$ gas and a step of removing residual gas are sequentially performed is performed once or more (a predetermined number of times), that is, when one cycle including the step of supplying TDEAT gas, the step of removing residual gas, the step of supplying $NH_3$ gas and the step of removing residual gas is performed only n times (where n is an integer of 1 or more), a TiN film containing an impurity having a predetermined thickness (e.g., range of 0.1 nm to 5 nm) is formed on the wafer 200.

Also, by performing the step of plasma treatment on the TiN film including C or H serving as an impurity, plasma is generated in atmospheres of $H_2$ gas serving as a reducing gas and $N_2$ gas serving as a nitriding gas, and the TiN film containing an impurity is exposed by the plasma (referred to as $H_2+N_2$ plasma). Then, H active species generated by exciting $H_2$ gas to plasma bond with C or H which is an impurity in the TiN film, become $CH_3$ or the like, and is moved from the TiN film. By such a reduction reaction, C or H which is an impurity is removed from the TiN film containing C or H, and thus the TiN film having a low C concentration and/or H concentration is formed. Also, N active species generated by exciting $N_2$ gas to plasma is added to the TiN film from which the impurities is moved by the reduction reaction, the N active species has high energy, and the energy facilitates the crystallization of the TiN film. Resistivity is lowered by the crystallization of the TiN film. Also, in the step of plasma treatment, it is possible to adjust the work function of the TiN film that can be obtained by adjusting an amount of C or H serving as an impurity which is reduced by the $H_2$ gas excited by a plasma.

<Modification 2>

In Modification 2, a TiN film is formed on the wafer 200 using two types of source gases. In this case, a reaction gas is not used. That is, the TiN film is formed on the wafer 200 using $TiCl_4$ gas and TDEAT gas as [Formula 4].

 [Formula 4]

Specifically, When a cycle in which a step of supplying $TiCl_4$ gas, a step of removing residual gas, a step of supplying TDEAT gas and a step of removing residual gas are sequentially performed is performed once or more (a predetermined number of times), that is, when one cycle including the step of supplying TiCl₄ gas, the step of removing residual gas, the step of supplying TDEAT gas and the step of removing residual gas is performed only n times (where n is an integer of 1 or more), a TiN film containing an impurity having a predetermined thickness (e.g., range of 0.1 nm to 5 nm) is formed on the wafer 200. In this case, the impurity contained in the TiN film is Cl, C, H or the like.

When the TiN film is formed using only an inorganic source gas and a reaction gas, a film-forming rate is decreased, and thus throughput may be decreased to 0.3 Å/cycle. When the TiN film is formed using only an organic source gas and a reaction gas, the resistivity of the formed TiN film containing lots of impurities may be increased. In this manner, when two types of the inorganic source gas and the organic source gas are used, merits of the two gases are improved, the film-forming rate is increased and the resistivity may be reduced. Also, the work function may be modified by adjusting an amount of the impurities contained in the TiN film. Since processing sequences and processing conditions in each step are substantially the same as those in the above-described first embodiment and Modification 1, a detailed description thereof is omitted.

(3) Effects of the Present Embodiment

According to the present embodiment, one or a plurality of effects to be described will be obtained.

In the present embodiment, the following effects may be obtained. (A) The $H_2$ gas activated by exciting by plasma is supplied to the TiN film containing an impurity, the impurity is removed from the TiN film by the reducing action of H active species, and thus it is possible to form the TiN film having a low resistivity. (B) The $N_2$ gas added to the $H_2$ gas activated by exciting by plasma is supplied to the TiN film containing an impurity, N active species penetrate into the TiN film from which the impurity is removed, the N concentration is increased, and thus it is possible to modify the work function. (C) As the TiN film which is a thin film is formed by supplying a plurality of process gases onto the substrate a predetermined number of times in temporally separated pulses (in a non-simultaneous manner), a concentration of the impurity contained in the film is decreased in a case in which the plurality of process gases are supplied simultaneously and the TiN film which is a thick film is formed by a gas phase reaction, and thus resistivity may be decreased by plasma treatment (a nitriding reaction is not performed sufficiently on the thick film formed by the above-described method compared to the thin film formed by the above-described method). (D) As the plasma treatment time in which the $H_2$ gas and the $N_2$ gas activated by exciting by plasma are supplied to the TiN film containing an impurity is changed, it is possible to tune the resistivity of the TiN film. (E) When the $H_2$ gas and the $N_2$ gas activated by exciting by plasma are supplied onto the TiN film containing an impurity, it is possible to tune the resistivity of the TiN film by adjusting a value of the self bias. (F) When the $H_2$ gas and the $N_2$ gas activated by exciting by plasma are supplied onto the TiN film containing an impurity, the self bias is adjusted by adjusting the value of the self bias, the N concentration is controlled, and thus it is possible to tune the work function. (G) When the TiN film containing an impurity is formed, using two types of gases, the inorganic source gas and the organic source gas, merits of two gases are improved, the film-forming rate is increased, and the resistivity may be reduced, and it is possible to modify the work function by adjusting an amount of the impurities contained in the TiN film.

Embodiment 1

The TiN film containing an impurity is formed on the wafer 200 by the sequence in Modification 2 using the above-described substrate processing apparatus 100. The process conditions are as follows.

Pressure in the process chamber 201: 50 Pa, temperature of the wafer 200: 300° C., supply flow rate of the TiCl₄ gas: 0.007 slm, supply flow rate of the $N_2$ gas when supplying TiCl₄ gas: 0.46 slm, supply time of the TiCl₄ gas: 2 seconds, supply flow rate of the TDEAT gas: 0.0015 slm, supply flow rate of the $N_2$ gas when supplying TDEAT gas: 0.46 slm and supply time of the TDEAT gas: 10 seconds According to a pre-analysis by the inventors, concentrations of N, C and Cl included in the TiN film formed by the process conditions are 22 atomic %, 16 atomic % and 9 atomic %, respectively. As an impurity, C or Cl is included. The film thickness of the TiN film is 5 nm.

Then, plasma treatment is performed on the wafer 200 on which the TiN film containing an impurity is formed using the substrate processing apparatus 600. In Embodiment 1, by varying the plasma treatment time, the resistivity of the TiN film, TiN (200) peak intensity, the work function of the TiN film and the time dependency with respect to penetration depths of N and H included in the TiN film are investigated. The process conditions are as follows.

Figure 7:
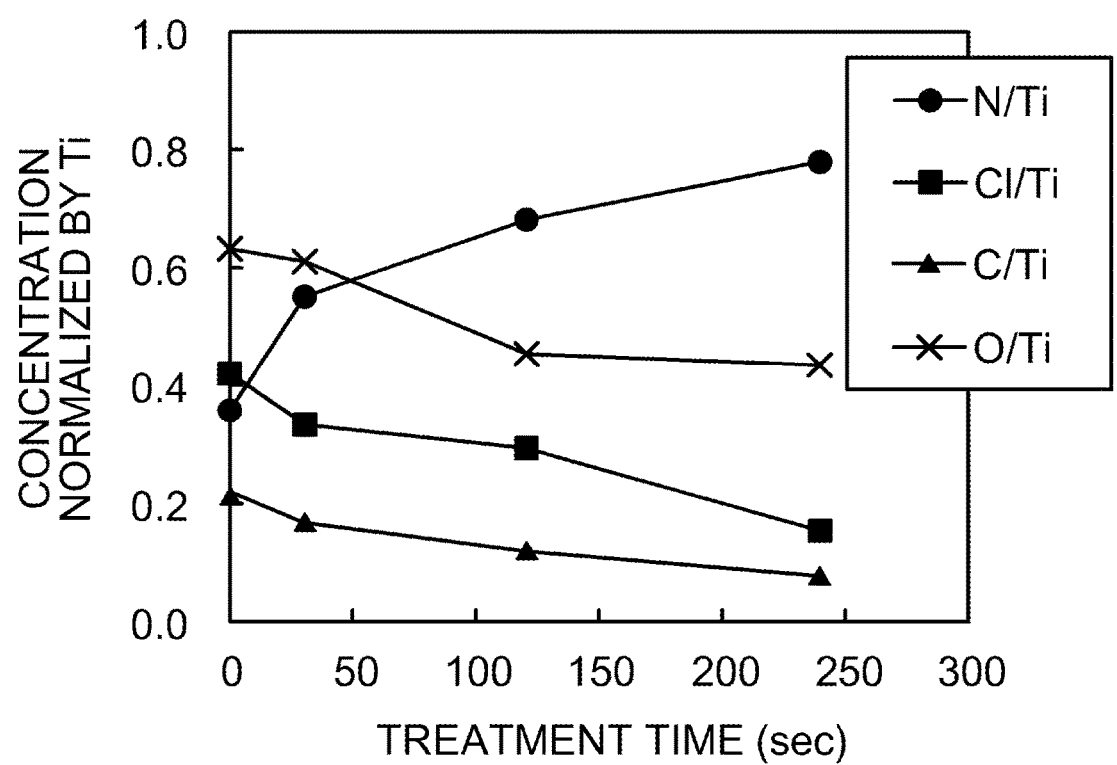
FIG. 7 is a graph illustrating changes in concentrations of elements (N, Cl, C and O) with respect to plasma treatment time (seconds) in the first embodiment of the present invention.

Pressure in the process chamber 601: 20 Pa, temperature of the wafer 200: 400° C., supply ratio of $N_2$ gas and $H_2$ gas (supply flow rates): $N_2$:$H_2$=1:1 (0.3 slm:0.3 slm), RF power: 700 W, self bias: 340 V and plasma treatment time: 0 second, 30 seconds, 120 seconds or 240 seconds FIG. 7 illustrates changes in the concentrations of elements (N, Cl, C and O) with respect to plasma treatment time (seconds). The concentration of each element is measured using secondary ion mass spectrometry (SIMS) and is normalized by Ti concentration as 1. In the drawing, ● (circle) represents N concentration, ■ (rectangle) represents Cl concentration, ▲ (triangle) represents C concentration and X (cross) represents O concentration. As the plasma treatment time is increased, it may be seen that the concentrations of impurities (Cl, C and O) are decreased and the concentration of N is increased.

Figure 8:
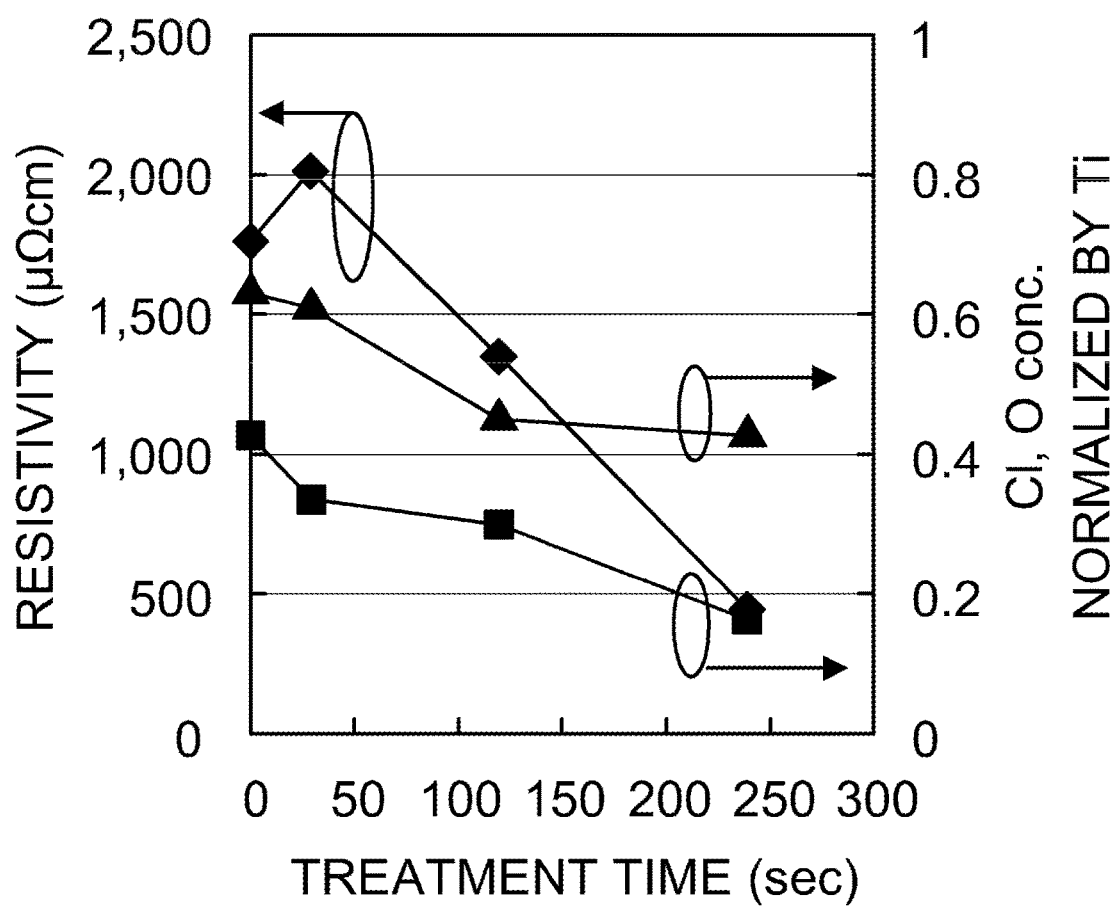
FIG. 8 is a graph illustrating changes in the resistivity of a TiN film and concentrations of impurities (Cl and O) with respect to plasma treatment time (seconds) in the first embodiment of the present invention.

FIG. 8 illustrates changes in the resistivity of the TiN film and the concentrations of impurities (Cl and O) with respect to plasma treatment time (seconds). Here, O is made by natural oxidation. The resistivity of the TiN film is measured using a four wire system and the composition thereof is measured using X-ray photoelectron spectroscopy (XPS). In the drawing, ♦ (diamond) represents resistivity (μΩ·cm), ■ (rectangle) represents Cl concentration (normalized by Ti concentration as 1) and ▲ (triangle) represents O concentration. As the plasma treatment time is increased, it may be seen that the resistivity and the concentrations of impurities (Cl and O) are decreased. As the plasma treatment time is increased, it is considered that the removal of the impurity is facilitated, impurities scattering is reduced, and thus the resistivity may be reduced.

Figure 9:
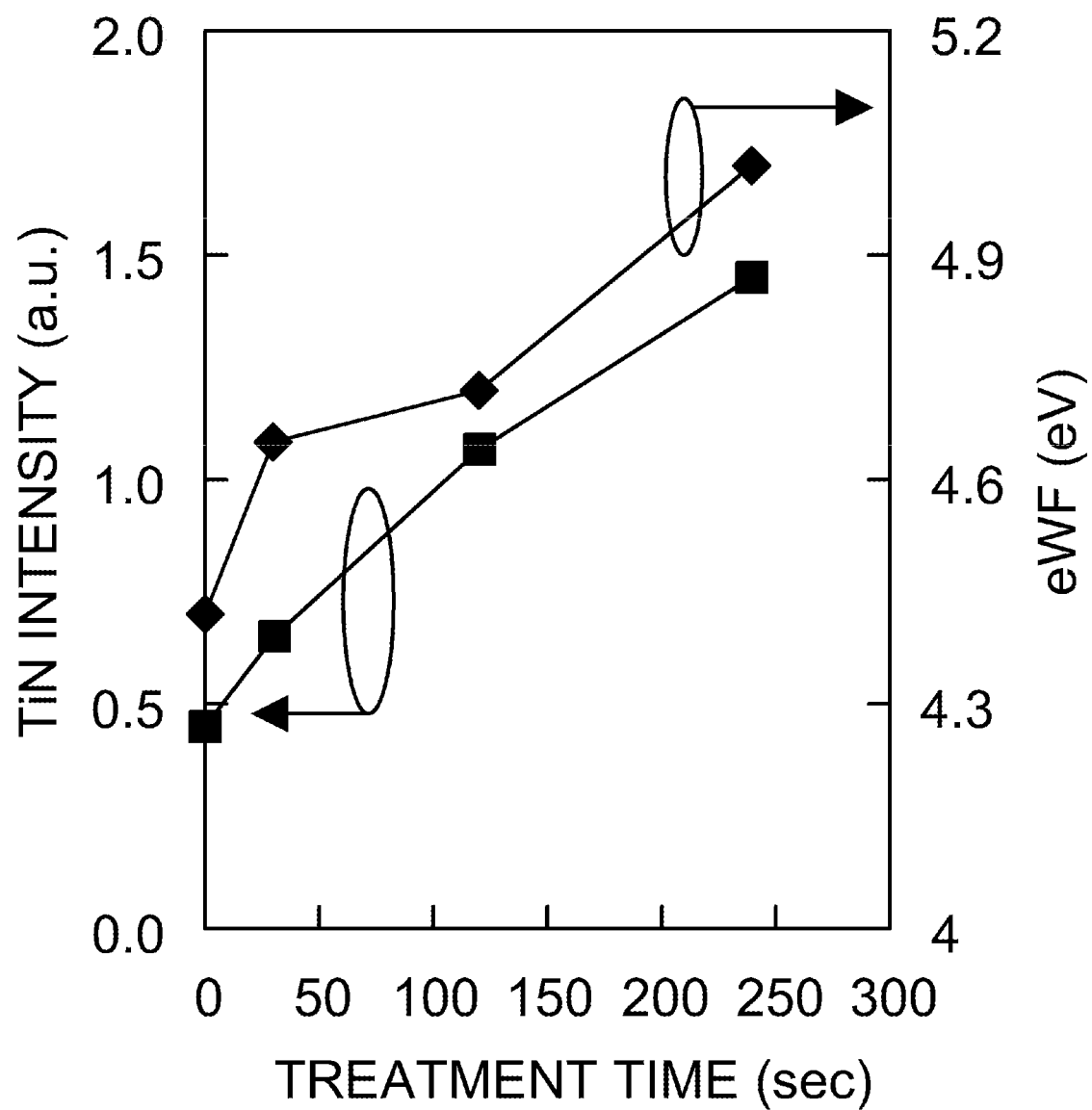
FIG. 9 is a graph illustrating a relationship between a change in TiN peak intensity and an effective work function with respect to plasma treatment time (seconds) in the first embodiment of the present invention.

FIG. 9 illustrates a relationship between changes in the peak intensity of TiN (200) and an effective work function (hereinafter, referred to simply as a work function) with respect to plasma treatment time (seconds). The peak intensity of TiN (200) is measured using X-ray diffraction (XRD). In the drawing, ■ (rectangle) represents TiN (200) peak intensity (a.u.) and ♦ (diamond) represents a work function eWF (eV). As the plasma treatment time is increased, it may be seen that the peak intensity is increased, and thus crystallization proceeds. This is because the impurities of the TiN film are removed by the plasma treatment, N having high energy enters the plasma after the impurities are removed, and thus the crystallization of the TiN film proceeds. As the plasma treatment time is increased, it is thought that N having high energy is further added, and thus crystallization proceeds. Also, as the plasma treatment time is increased, it may be seen that the crystallization proceeds and the work function is increased.

Figure 10:
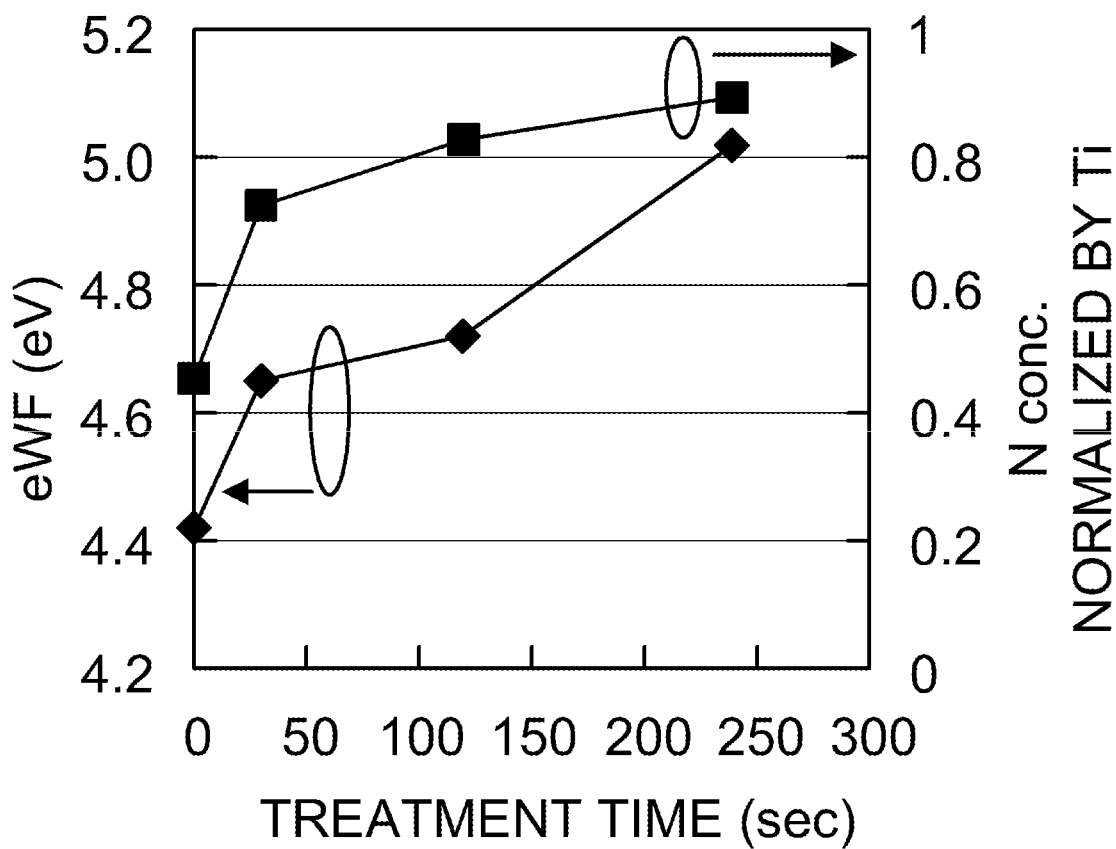
FIG. 10 is a graph illustrating a relationship between a change in an effective work function and a nitrogen (N) concentration with respect to plasma treatment time (seconds) in the first embodiment of the present invention.

FIG. 10 illustrates a relationship between the change in a work function and N concentration with respect to plasma treatment time (seconds). In the drawing, ♦ (diamond) represents a work function eWF (eV) and ■ (rectangle) represents N concentration (normalized by Ti concentration as 1, Ni/Ti). As the plasma treatment time is increased, the work function is increased and may have a value about 0.2 eV greater than a conventional TiN film. As the plasma treatment time is increased, since a lot of N having high electronegativity is added to the film by increasing the N concentration, it is thought that the work function is increased.

Figure 11:
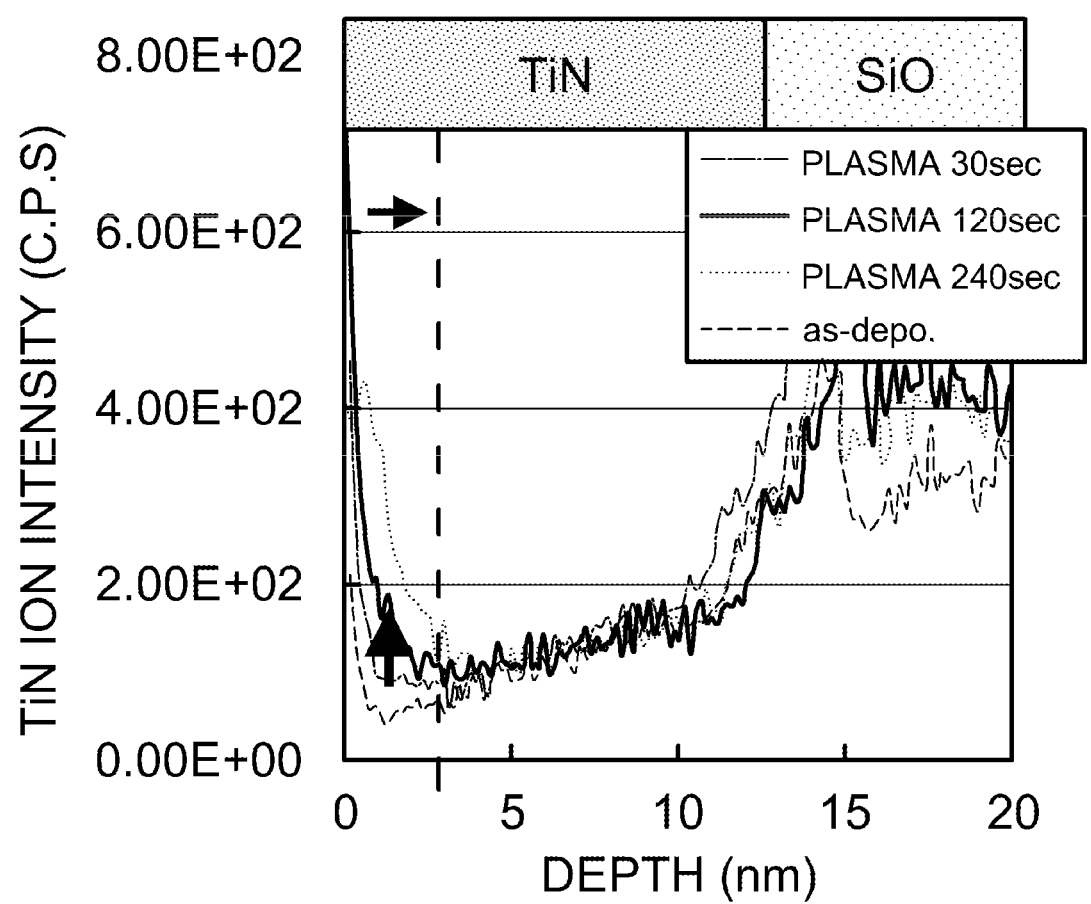
FIG. 11 is a diagram illustrating TiN ion intensity (C. P. S) in a depth (nm) direction with respect to plasma treatment time (seconds) in the first embodiment of the present invention.

FIG. 11 illustrates TiN ion intensity (C. P. S) in a depth (nm) direction with respect to plasma treatment time (seconds). The TiN ion intensity relates to the N concentration, and it may be considered that a depth of the TiN ion intensity to be substantially constant refers to a penetration depth limit of N. The plasma treatment time of each piece of data represents a thin line: 30 seconds, a thick line: 120 seconds, a dotted line: 240 seconds or a dashed line: 0 second (no plasma treatment). The TiN film is formed on a silicon nitride film (SiN film) and the film thickness of the TiN film is about 13 nm. As the plasma treatment time is increased, it may be seen that the TiN ion intensity is increased and N penetrates deeply. It may be seen that the TiN ion intensity is constant in the vicinity of about 3 nm and the main penetration depth of N is up to about 3 nm.

Figure 12:
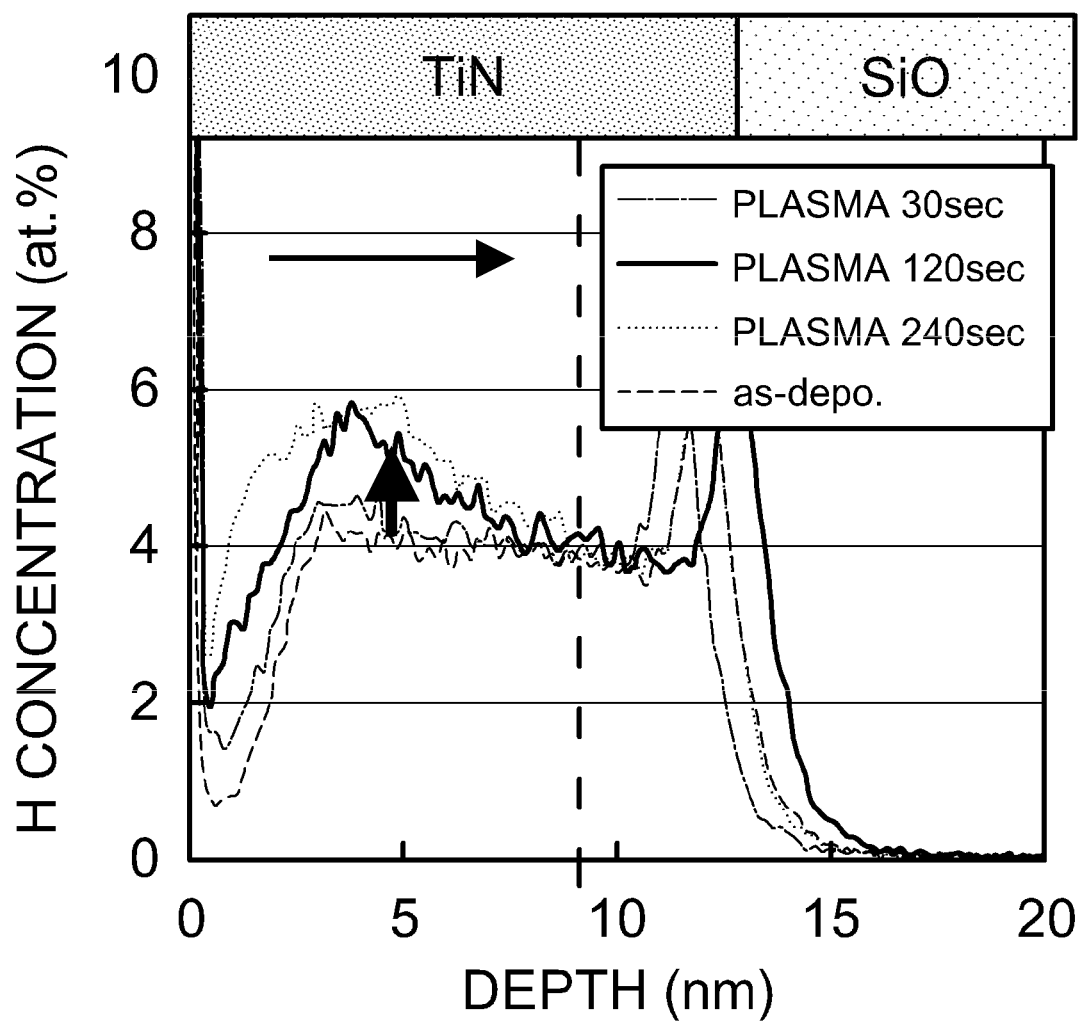
FIG. 12 is a graph illustrating a hydrogen (H) concentration in a depth (nm) direction with respect to plasma treatment time (seconds) in the first embodiment of the present invention.

FIG. 12 illustrates H concentration in a depth (nm) direction with respect to plasma treatment time (seconds). It may be thought that a depth of an H concentration to be substantially constant refers to a penetration depth limit of H. The plasma treatment time of each piece of data represents a thin line: 30 seconds, a thick line: 120 seconds, a dotted line: 240 seconds or a dashed line: 0 second (no plasma treatment). The TiN film is formed on a silicon nitride film (SiN film) and the film thickness of the TiN film is about 13 nm. As the plasma treatment time is increased, it may be seen that the H concentration is increased and H penetrates deeply. It may be seen that the H concentration is constant in the vicinity in a range of about 8 nm to 9 nm and the main penetration depth of H is within a range of about 8 nm to 9 nm.

Embodiment 2

Using the above-described substrate processing apparatus 100, the TiN film containing an impurity is formed on the wafer 200 by the sequence in Modification 2 using the same process conditions as the embodiment 1. Then, plasma treatment is performed on the wafer 200 on which the TiN film containing an impurity is formed using the substrate processing apparatus 600. In Embodiment 2, by varying the self bias, the resistivity of the TiN film, TiN (200) peak intensity, the work function of the TiN film and the time dependency with respect to penetration depths of N and H included in the TiN film are investigated. The plasma treatment time is set to 120 seconds, and the self bias is changed as follows. Other process conditions used the same conditions as in Embodiment 1 are omitted.

Self bias: 0 V, 55 V, 340 V or 435 V

Figure 13:
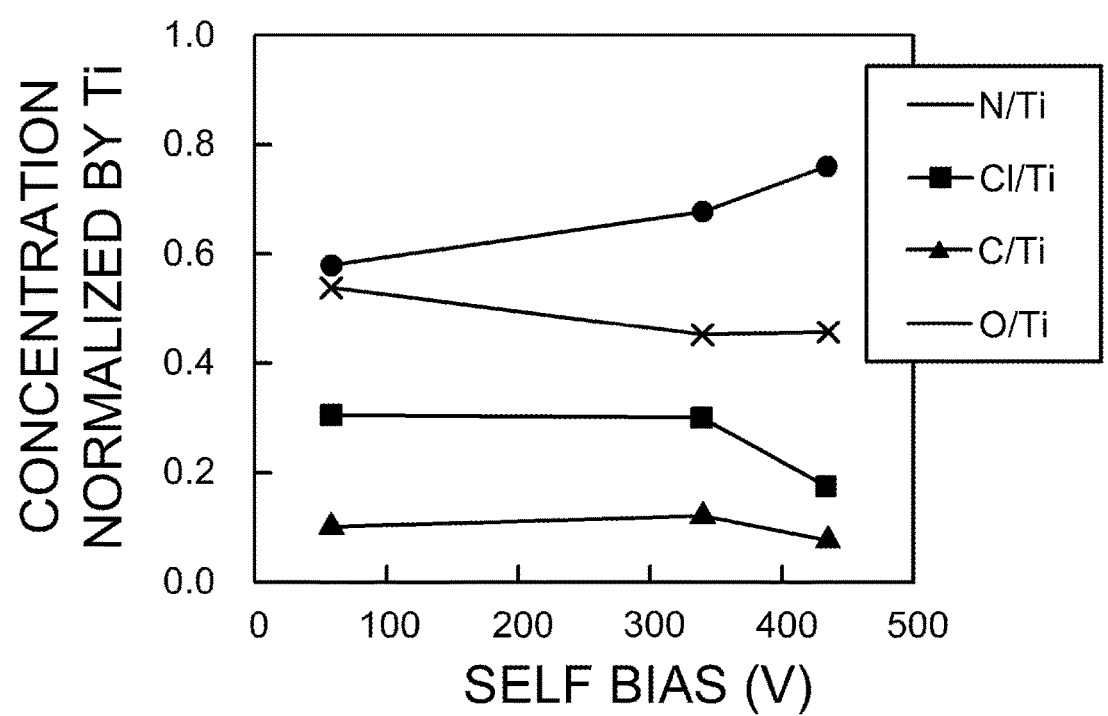
FIG. 13 is a graph illustrating changes in concentrations of elements (N, Cl, C and O) with respect to a self bias (V) in a second embodiment of the present invention.

FIG. 13 illustrates changes in the concentrations of elements (N, Cl, C and O) with respect to a self bias (V). The concentration of each element is measured using SIMS and is normalized by Ti concentration as 1. In the drawing, ● (circle) represents N concentration, ■ (rectangle) represents Cl concentration, ▲ (triangle) represents C concentration and X (cross) represents O concentration. It may be seen that the Cl concentration and the C concentration are almost unchanged when the self bias is in a range of 55 V to 340 V and are decreased when the self bias is increased to 435 V. Also, it may be seen that the O concentration is decreased when the self bias is in a range of 55 V to 340 V and is almost unchanged when the self bias is in a range of 340 V to 435 V. Meanwhile, as the self bias is increased, it may be seen that the N concentration is increased.

Figure 14:
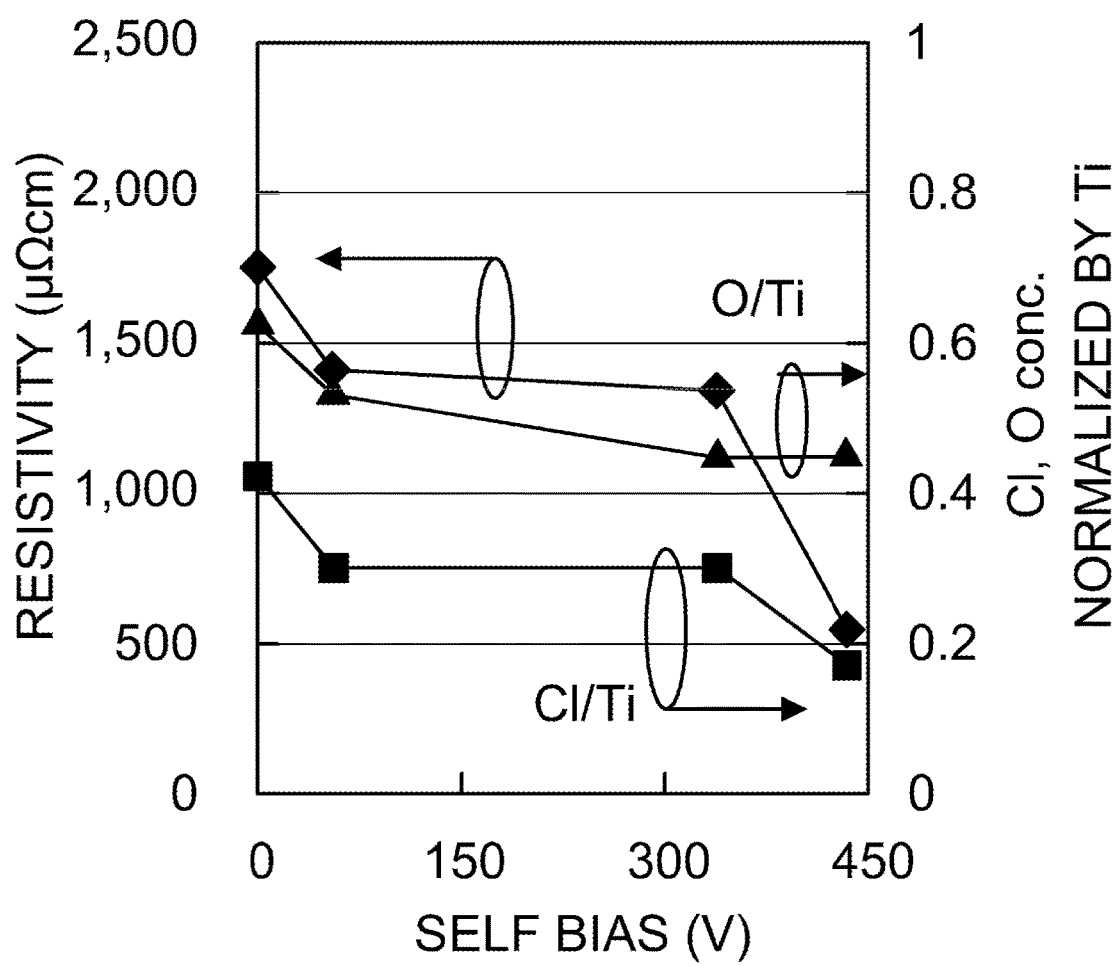
FIG. 14 is a graph illustrating changes in the resistivity of a TiN film and concentrations of impurities (Cl and O) with respect to a self bias (V) in the second embodiment of the present invention.

FIG. 14 illustrates changes in the resistivity of the TiN film and the concentrations of impurities (Cl and O) with respect to self bias (V). O is made by natural oxidation. In the drawing, ♦ (diamond) represents resistivity (μΩ·cm), ■ (rectangle) represents Cl concentration (normalized by Ti concentration as 1) and ▲ (triangle) represents O concentration. As the self bias is increased, it may be seen that the resistivity and the impurities (Cl and O) concentrations may be reduced.

Figure 15:
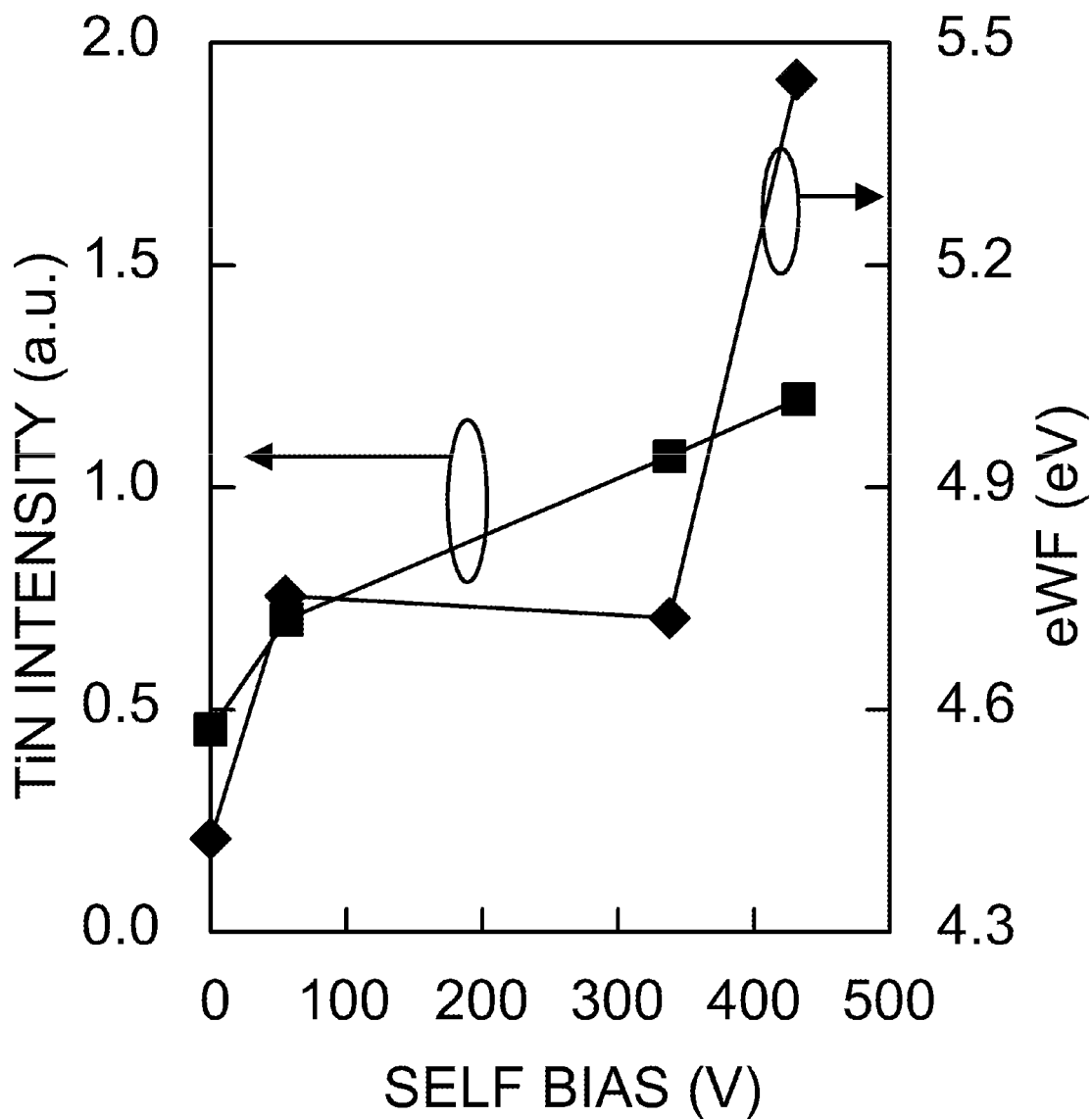
FIG. 15 is a graph illustrating a relationship between a change in TiN peak intensity and an effective work function with respect to a self bias (V) in the second embodiment of the present invention.

FIG. 15 illustrates a relationship between changes in the peak intensity of TiN (200) and a work function with respect to self bias (V). In the drawing, ■ (rectangle) represents TiN (200) peak intensity (a.u.) and ♦ (diamond) represents a work function eWF (eV). As the self bias is increased, it may be seen that the peak intensity is increased, and thus crystallization proceeds. This is because the impurities of the TiN film are removed by the plasma treatment, N having high energy enters the plasma after the impurities are removed, and thus the crystallization of the TiN film proceeds. As the self bias is increased, it is considered that N having high energy is further added, and thus crystallization proceeds. Also, as the self bias is increased, it may be seen that the crystallization proceeds and the work function is increased.

Figure 16:
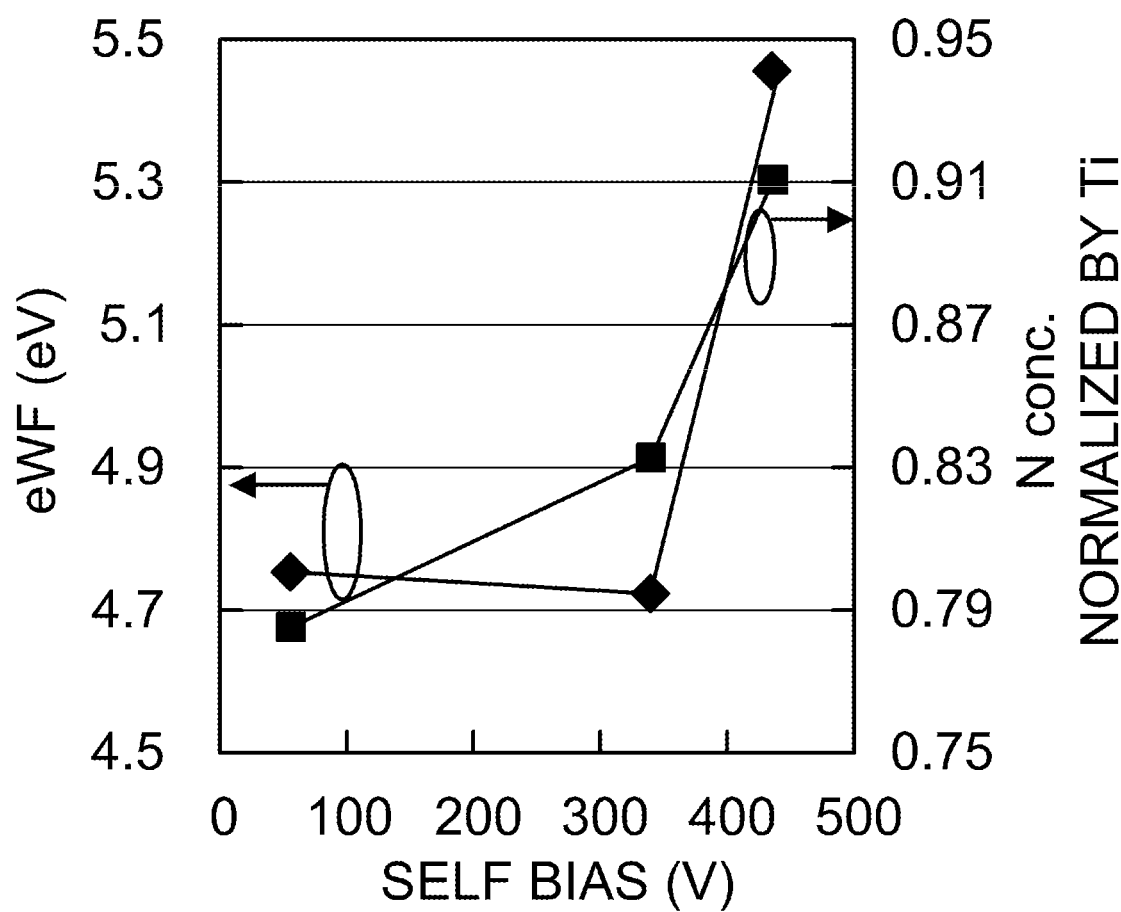
FIG. 16 is a graph illustrating a relationship between a change in an effective work function and a nitrogen (N) concentration with respect to a self bias (V) in the second embodiment of the present invention.
Figure 17:
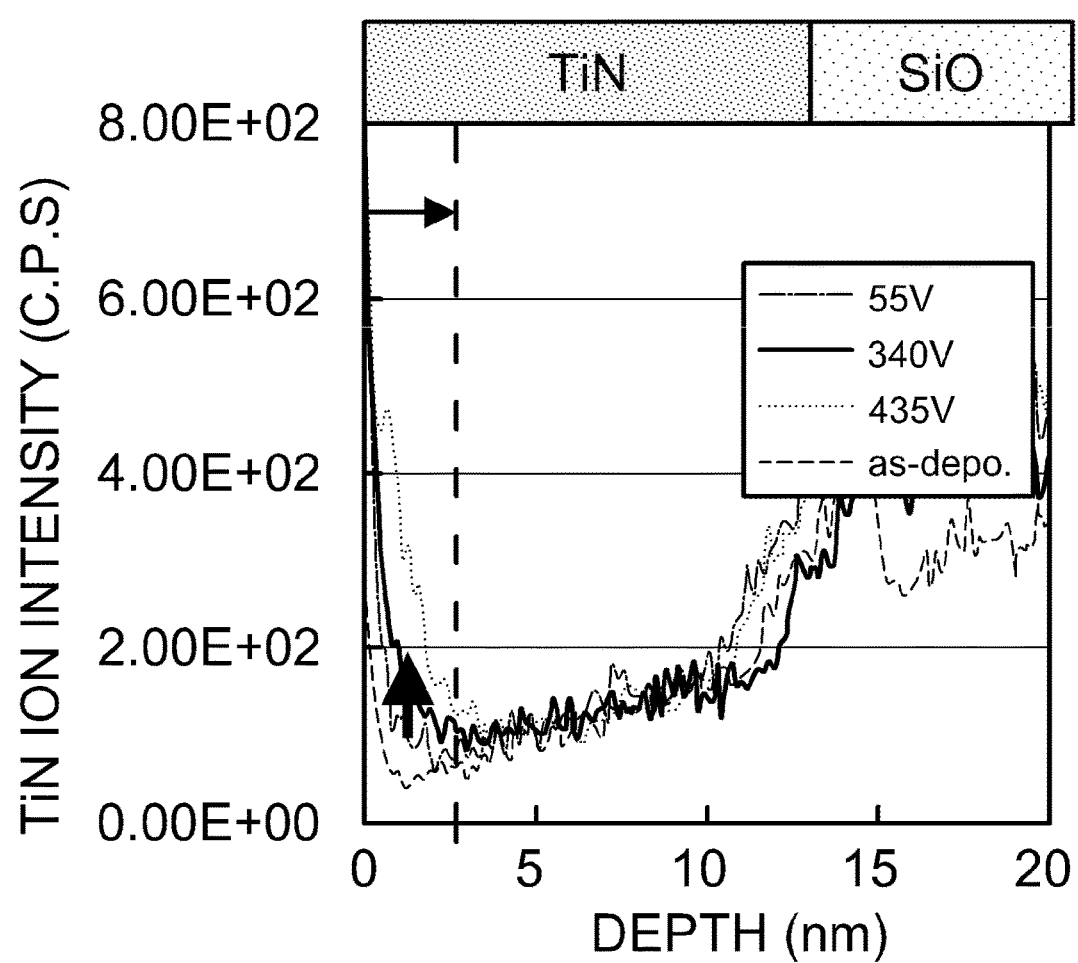
FIG. 17 is a graph illustrating TiN ion intensity (C. P. S) in a depth (nm) direction with respect to a self bias (V) in the second embodiment of the present invention.
Figure 18:
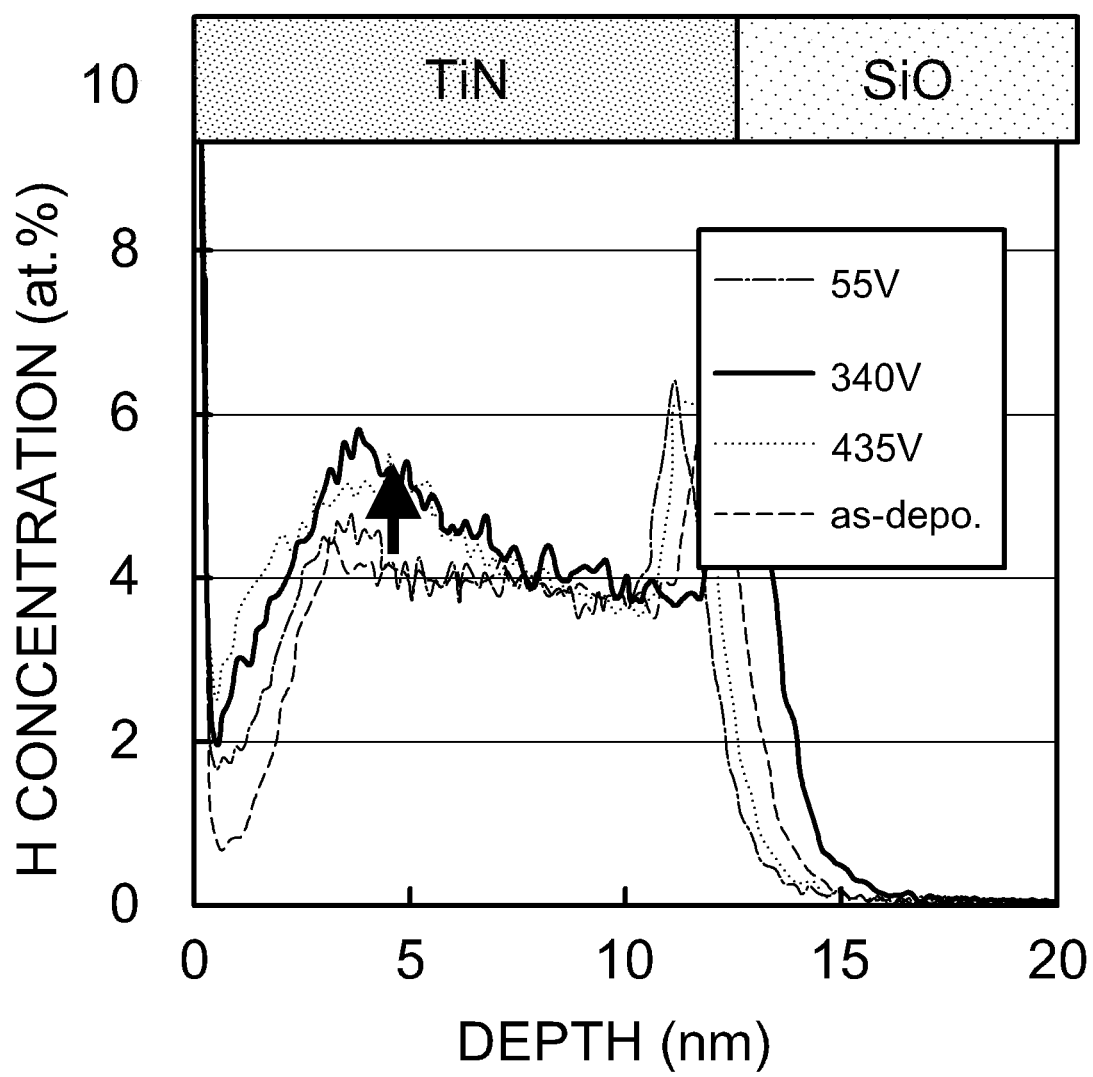
FIG. 18 is a graph illustrating a hydrogen (H) concentration in a depth (nm) direction with respect to a self bias (V) in the second embodiment of the present invention.

FIG. 16 illustrates a relationship between the change in a work function and N concentration with respect to self bias (V). In the drawing, ♦ (diamond) represents a work function eWF (eV) and ■ (rectangle) represents N concentration (normalized by Ti concentration as 1, Ni/Ti). As the self bias is increased, the work function is increased. As the self bias is increased, since a lot of N having high electronegativity is added to the film by increasing the N concentration, it is thought that the work function is increased.

FIG. 11 illustrates TiN ion intensity in a depth (nm) direction with respect to self bias (V). The TiN ion intensity relates to the N concentration, and it may be thought that a depth of the TiN ion intensity to be substantially constant refers to a penetration depth limit of N. The self bias of each piece of data represents a thin line: 355 V, a thick line: 340 V, a dotted line: 435 V or a dashed line: 0 V (no plasma treatment). The TiN film is formed on a silicon nitride film (SiN film), and the film thickness of the TiN film is about 13 nm. As the self bias is increased, it may be seen that the TiN ion intensity is increased and N penetrates deeply. It may be seen that the TiN ion intensity is constant in the vicinity of about 3 nm, and the main penetration depth of N is up to about 3 nm.

FIG. 12 illustrates H concentration in a depth (nm) direction with respect to self bias (V). It may be considered that a depth of an H concentration to be substantially constant refers to a penetration depth limit of H. The self bias of each piece of data represents a thin line: 355 V, a thick line: 340 V, a dotted line: 435 V or a dashed line: 0 V (no plasma treatment). The TiN film is formed on a silicon nitride film (SiN film), and the film thickness of the TiN film is about 13 nm. As the self bias is increased, it may be seen that the H concentration is increased, and H penetrates deeply. It may be seen that the H concentration is constant in the vicinity in a range of about 8 nm to 9 nm, and the main penetration depth of H is up to n a range of about 8 nm to 9 nm.

In the above-described embodiment, an example of the film formation using the substrate processing apparatus which is a batch-type vertical apparatus for processing a plurality of substrates at a time is used as the substrate processing apparatus 100 and the processing furnace having a structure in which the nozzle configured to supply the process gas stands in a single reaction tube and an exhaust port is installed under the reaction tube is described. However, the present invention may be applied to a case of the film forming using a processing furnace having another structure. For example, the present invention may be applied to a case of the film forming using two reaction tubes (a reaction tube at the outside is referred to as an outer tube and a reaction tube at the inside is referred to as an inner tube) having a concentric-shaped cross-section and the processing furnace having a structure in which the process gas flows from the nozzle standing in the inner tube into an exhaust port that opens at a position (symmetrical position) opposite the nozzle with the substrate therebetween, which is a side wall of the outer tube. Also, the process gas is not supplied through the nozzle standing in the inner tube and may be supplied through the gas supply port that opens at the side wall of the inner tube. In this case, the exhaust port configured to open the outer tube may be open according to the height of the plurality substrates which are stacked and accommodated in the process chamber. Also, the shape of the exhaust port may have a hole shape or a slit shape.

Also, for example, the plasma generating mechanism is added to the substrate processing apparatus 100, and then the formation of the thin film on the substrate and the plasma treatment for the thin film may be additionally performed.

Second Embodiment of the Present Invention

In the above-described embodiment, an example of the film formation using the substrate processing apparatus which is a batch-type vertical apparatus for processing a plurality of substrates at a time is described, but the present invention is not limited thereto. The present invention is preferably applied to a case of the film forming using a single substrate processing apparatus for processing a single substrate or a plurality of substrates at a time. Also, in the above-described embodiment, an example of forming the thin film using a substrate processing apparatus having a hot-wall-shaped processing furnace is described, but the present invention is not limited thereto. The present invention is preferably applied to a case of forming the thin film using a substrate processing apparatus having a cold-wall-shaped processing furnace. In this case, the processing conditions may be, for example, the same processing conditions as the above-described embodiment.

Figure 19:
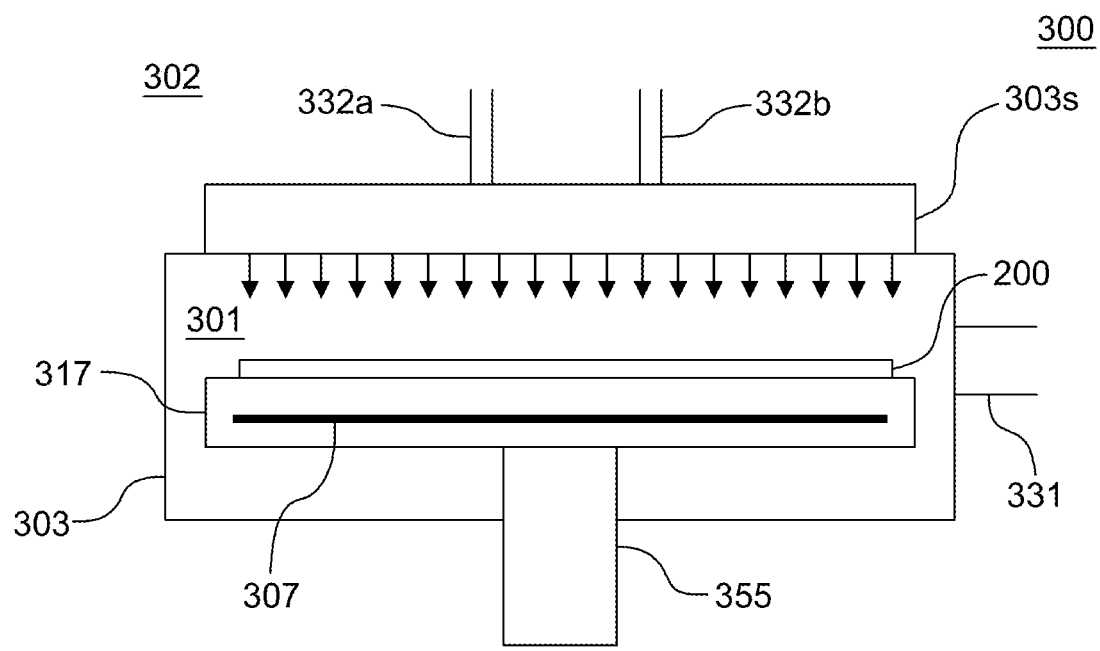
FIG. 19 is a configuration diagram schematically illustrating a processing furnace of a substrate processing apparatus preferably used in the second embodiment of the present invention, and is a longitudinal sectional view illustrating the processing furnace.

For example, the present invention is preferably applied to a case of the film formation using the substrate processing apparatus 300 having the processing furnace 302 illustrated in FIG. 19 rather than the substrate processing apparatus 100. The processing furnace 302 includes a process container 303 configured to form a process chamber 301, a shower head 303s configured to supply a gas into a process chamber 301 in a shower shape, a support 317 configured to support a single wafer or a plurality of wafers 200 in a horizontal orientation, a rotary shaft 355 configured to support the support 317 from below and a heater 307 installed in the support 317. The gas supply port 332a configured to supply the above-described source gas and the gas supply port 332b configured to supply the above-described reaction gas are connected to the inlet (gas inlet) of the shower head 303s. The same source gas supply system as that of the above-described embodiment is connected to the gas supply port 332a. The same reaction gas supply system as that of the above-described embodiment is connected to the gas supply port 332b. A gas distribution plate configured to supply a gas into the process chamber 301 in a shower shape is installed in the outlet (gas discharge port) of the shower head 303s. The exhaust port 331 configured to exhaust the inside of the process chamber 301 is installed in the process container 303. The same exhaust system as that of the above-described embodiment is connected to the exhaust port 331.

Third Embodiment of the Present Invention

Figure 20:
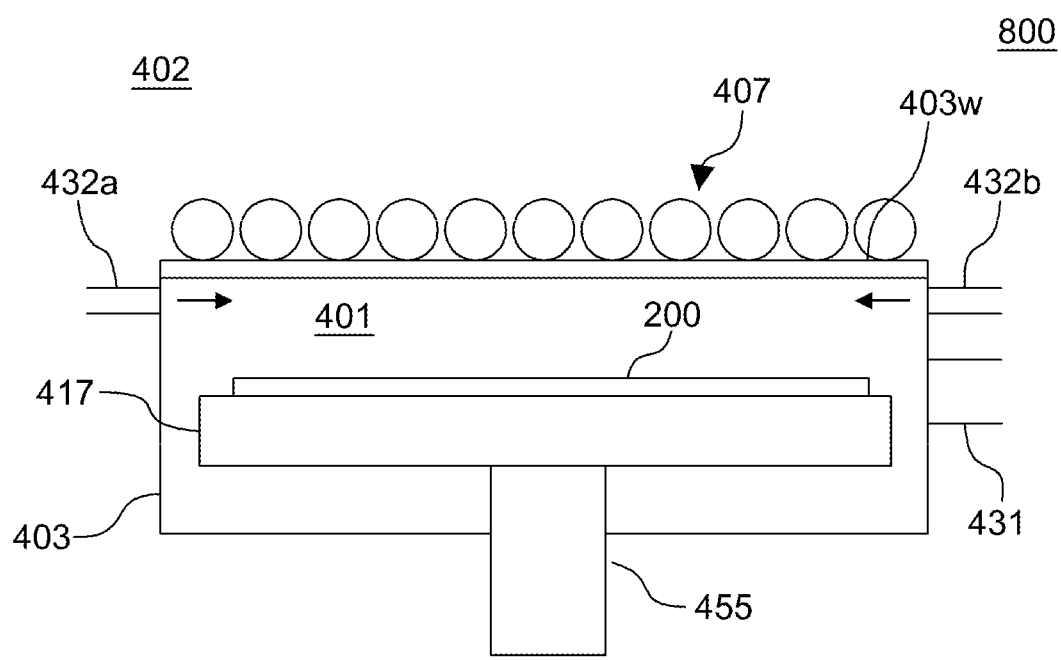
FIG. 20 is a configuration diagram schematically illustrating a processing furnace of a substrate processing apparatus preferably used in a third embodiment of the present invention, and is a longitudinal sectional view illustrating the processing furnace.

Also, for example, the present invention is preferably applied to a case of the film formation using the substrate processing apparatus 800 including the processing furnace 402 illustrated in FIG. 20 rather than the substrate processing system 10 including the substrate processing apparatuses 100 and 600. In this case, using light excitation rather than plasma excitation as a method of generating active species having high energy, it is possible to perform the formation of the thin film on the substrate and light treatment on the thin film by the single substrate processing apparatus 800. Also, the thin film is formed on the substrate by the substrate processing apparatus 800, and then it is possible to perform plasma treatment on the thin film formed on the substrate using the substrate processing apparatus 600. Also, the thin film is formed on the substrate processing apparatus 100 by the substrate, and then it is possible to perform light treatment on the thin film formed on the substrate using the substrate processing apparatus 800. In this case, the substrate processing apparatus 800 rather than the substrate processing apparatus 100 or the substrate processing apparatus 600 may also be included in the substrate processing system 10.

The processing furnace 402 includes a process container 403 configured to form a process chamber 401, a support 417 configured to support a single wafer or a plurality of wafers 200 in a horizontal orientation, a rotary shaft 455 configured to support the support 417 from below, a lamp heater 407 configured to perform light supply toward the wafer 200 of the process container 403, and a quartz window 403w configured to transmit light of the lamp heater 407. A gas supply port 432a configured to supply the above-described source gas and a gas supply port 432b configured to supply the above-described reaction gas are connected to the process container 403. The same source gas supply system as that of the above-described embodiment is connected to the gas supply port 432a. The same reaction gas supply system as that of the above-described embodiment is connected to the gas supply port 432b. An exhaust port 431 configured to exhaust the inside of the process chamber 401 is installed in the process container 403. The same exhaust system as that of the above-described embodiment is connected to the exhaust port 431.

The lamp heater 407 may be, for example, a mercury lamp configured to generate UV light using the bright-line emission of mercury. Also, the lamp heater 407 may be a lamp for which an amalgam which is an alloy of mercury and a metal is coated inside a quartz tube. Also, as the lamp heater 407, a plurality of straight tube type mercury lamps may be arranged in parallel, a plurality of U-shaped mercury lamps may be arranged in parallel, and a horseshoe-shaped mercury lamp may be used.

Fourth Embodiment of the Present Invention

Figure 21:
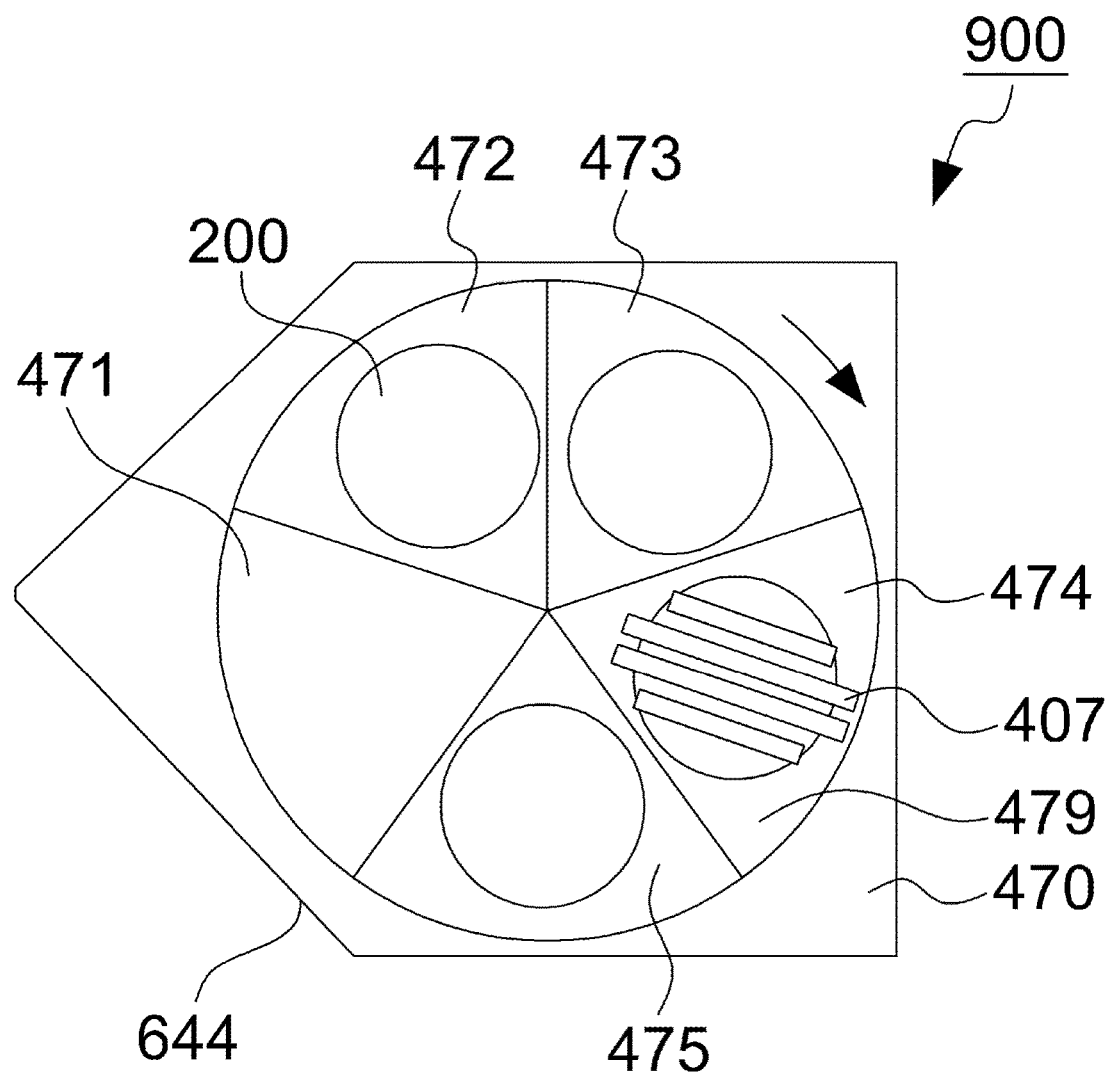
FIG. 21 is a configuration diagram schematically illustrating a processing furnace of a substrate processing apparatus preferably used in a fourth embodiment of the present invention, and is a longitudinal sectional view illustrating the processing furnace.

Also, for example, the substrate processing apparatus 900 illustrated in FIG. 21 rather than the substrate processing apparatus 100 and the substrate processing apparatus 600 may be included in the substrate processing system 10. The substrate processing apparatus 900 has a substrate revolving process chamber 470 connected to the transfer chamber 700 through the gate valve 644. The substrate revolving process chamber 470 includes a wafer replacement domain 471, a gas exposure domain 472, a purge domain 473, an UV processing domain 474 and a purge domain 475. The substrate processing apparatus 800 is used as the UV processing domain 474.

The substrate revolving process chamber 470 includes a turntable 479 as a mechanism configured to revolve the substrate in the order of the wafer replacement domain 471, the gas exposure domain 472, the purge domain 473, the UV processing domain 474 and the purge domain 475. When the wafer 10 which is a substrate is placed on the turntable 479 and the turntable 479 rotates in the clockwise direction, the wafer 200 is transferred in the order of the wafer replacement domain 471, the gas exposure domain 472, the purge domain 473, the UV processing domain 474 and the purge domain 475. The whole of the substrate revolving process chamber 470 including the turntable 479 constitutes a single processing system. The wafer replacement domain 471, the gas exposure domain 472, the purge domain 473, the UV processing domain 474 and the purge domain 475 are separated from each other by partitions made by each gas.

In such a configuration, the forming of the thin film by exposing the wafer 200 to a gas for film forming in the gas exposure domain 472 and the supply of UV light to the thin film in the UV processing domain 474 may be alternately performed. Further, a mechanism for rotating the substrate while revolving the substrate may also be used.

Fifth Embodiment of the Present Invention

Figure 22:
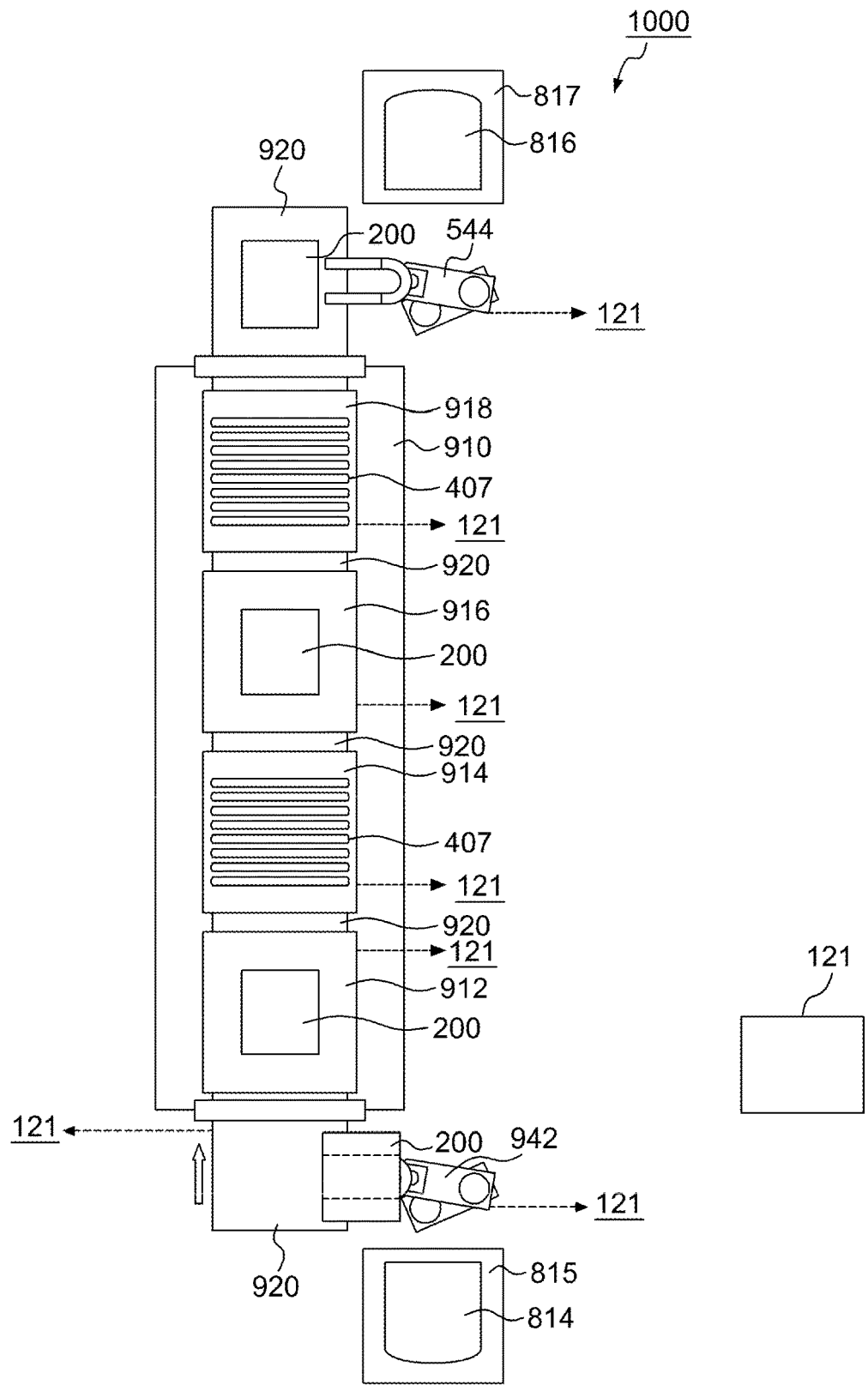
FIG. 22 is a configuration diagram schematically illustrating a processing furnace of a substrate processing apparatus preferably used in a fifth embodiment of the present invention, and is a longitudinal sectional view illustrating the processing furnace.

FIG. 22 is a schematic diagram for describing a substrate processing apparatus 1000 in which the substrate processing apparatus 800 illustrated in the third embodiment is disposed linearly (in a line shape). A film forming domain 912, an UV processing domain 914, a film forming domain 916 and an UV processing domain 918 are sequentially disposed inside a process housing 910. The substrate processing apparatus 800 illustrated in the third embodiment is used as the UV processing domains 914 and 918. The substrate 200 is placed on a linear conveyor 920 for transferring and transferred. A substrate transfer robot 942 is installed at a side of the linear conveyor 920 in front of the process housing 910 [in front of the film forming domain 912]. A wafer loader 815 is installed in a front side of the substrate transfer robot 942. A substrate transfer robot 944 is installed at a side of the linear conveyor 920 at a back side of the process housing 910 [a back side of the UV processing domain 918]. A wafer loader 817 is installed at a back side of the substrate transfer robot 944. The substrate 200 transferred to the wafer loader 815 by the cassette 814 is transferred to the linear conveyor 920 by the substrate transfer robot 942. Then, the substrate 200 mounted on the linear conveyor 920 is transferred in the order of the film forming domain 912, the UV processing domain 914, the film forming domain 916 and the UV processing domain 918. Then, the substrate 200 is transferred to a back side of the process housing 910 [a back side of the UV processing domain 918] by the linear conveyor 920, and to the cassette 819 of the wafer loader 817 by the substrate transfer robot 944. Then, the substrate 200 is unloaded from the substrate processing apparatus 1000. In the present embodiment, since the substrate 200 is transferred linearly, the substrate 200 is not limited to a circular substrate such as a wafer, and a rectangular or square substrate may be transferred. Also, in the present embodiment, a case in which four process domains are used and two of them are the UV processing domains is described as an example. However, the number of domains or the number of UV processing units used in the domains may be changed arbitrarily, and a combination with a lamp unit for film-forming or heating or a cure unit such as microwave or the like may be selected arbitrarily. Also, each of components is controlled by the controller 121.

Even when these substrate processing apparatuses are used, the film formation may be performed by the same sequence and processing conditions as those in the above-described embodiment or modifications In the above-described embodiment, an example in which the TiN film is formed as a thin film is described, but the present invention is not limited thereto. The above-described embodiment may be applied to a film made of a single element such as titanium (Ti), tantalum (Ta), tungsten (W), cobalt (Co), yttrium (Y), ruthenium (Ru), aluminum (Al), hafnium (Hf), zirconium (Zr), molybdenum (Mo), silicon (Si) and the like, at least one film of a nitride film, an oxide film, a carbon film and a boron film including these elements or a composition film thereof.

When a film including the above-described elements is formed, as a source gas, in addition to a titanium-containing gas, a tantalum-containing gas, a tungsten-containing gas, a cobalt-containing gas, an yttrium-containing gas, a ruthenium-containing gas, an aluminum-containing gas, a hafnium-containing gas, a zirconium-containing gas, a molybdenum-containing gas, a silicon-containing gas or the like may be used.

When a film including the above-described elements is formed, as an inorganic source gas, in addition to $TiCl_4$, for example, titanium tetrafluoride ($TiF_4$), tantalum pentachloride ($TaCl_5$), tantalum pentafluoride ($TaF_4$), tungsten hexachloride ($WCl_6$), tungsten hexafluoride ($WF_6$), cobalt dichloride ($CoCl_2$), cobalt difluoride ($CoF_2$), yttrium trichloride ($YCl_3$), yttrium trifluoride ($YF_3$), ruthenium trichloride ($RuCl_3$), ruthenium trifluoride ($RuF_3$), aluminum trichloride ($AlCl_3$), aluminum trifluoride ($AlF_3$), hafnium tetrachloride ($HfCl_4$), hafnium tetrafluoride ($HfF_4$), zirconium tetrachloride ($ZrCl_4$), zirconium tetrafluoride ($ZrF_4$), tetrachlorosilane, that is, silicon tetrachloride ($SiCl_4$, abbreviated to: STC), trichlorosilane ($SiHCl_3$, abbreviated to: TCS), dichlorosilane ($SiH_2Cl_2$, abbreviated to: DCS), monochlorosilane ($SiH_3Cl$, abbreviated to: MCS), hexachlorodisilane ($Si_2Cl_6$, abbreviated to: HCDS) or the like may be used.

Also, as the organic source gas, in addition to TDEAT, for example, tetrakis(dimethylamino)titanium ($Ti[N(CH_3)_2]_4$, abbreviated to: TDMAT), penta(ethoxy)tantalum [Ta(OC$_2$H$_5$)$_5$, abbreviated to: PET], trimethylaluminum [(CH$_3$)$_3$Al, abbreviated to: TMA], tetrakis(ethylmethylamino)hafnium (Hf[N(CH$_3$)CH$_2$CH$_3$]$_4$, abbreviated to: TEMAH), tetrakis(dimethylamino)hafnium (Hf[N(CH$_3$)$_2$]$_4$, TDMAH), tetrakis(diethylamido)hafnium (Hf[N(C$_2$H$_5$)$_2$]$_4$, abbreviated to: TDEAH), tetrakis(ethylmethylamino)zirconium (Zr[N(CH$_3$)CH$_2$CH$_3$]$_4$, abbreviated to: TEMAZ), tetrakis(dimethylamino)zirconium (Zr[N(CH$_3$)$_2$]$_4$, TDMAZ), tetrakis(diethylamino)zirconium (Zr[N(C$_2$H$_5$)$_2$]$_4$, abbreviated to: TDEAZ), tris(dimethylaminocyclopentadienyl)zirconium ((C$_5$H$_5$)Zr[N(CH$_3$)$_2$]$_3$), tetrakis(dimethylamino)silane (Si[N(CH$_3$)$_2$]$_4$, abbreviated to: 4DMAS), tris(dimethylamino)silane (Si[N(CH$_3$)$_2$]$_3$H, abbreviated to: 3DMAS), bis(diethylamino)silane (Si[N(C$_2$H$_5$)$_2$]$_2$H$_2$, abbreviated to: BDEAS), bis(tertiary-butyl-amino)silane (SiH$_2$[NH(C$_4$H$_9$)]$_2$, abbreviated to: BTBAS), bis(tertiarybutylamino)bis(tertiarybutylamino)tungsten ((C$_4$H$_9$NH)$_2$W(C$_4$H$_9$N)$_2$), tungstenhexacarbonyl (W(CO)$_6$), bis(ethylcyclopentadienyl)cobalt (C$_{14}$H$_{18}$Co), cobalthexacarbonyl (Co(CO)$_6$), tris(butylcyclopentadienyl)yttrium (Y(C$_5$H$_4$CH$_2$(CH$_2$)$_2$CH$_3$)$_3$), bis(ethylcyclopentadienyl)ruthenium (C$_{14}$H$_{18}$Ru) or the like may be used.

As a nitriding and reducing agent used in the formation of the thin film, in addition to NH$_3$ gas, a gas including N—H bond such as nitrogen (N$_2$), nitrous oxide (N$_2$O), diazine (N$_2$H$_2$) gas, hydrazine (N$_2$H$_4$) gas, N$_3$H$_8$ gas or the like may be used. Also, as the gas including N—H bond, in addition to the above-described gases, organic hydrazine-based gas, for example, methylhydrazine-based gas such as monomethylhydrazine ((CH$_3$)HN$_2$H$_2$, abbreviated to: MMH) gas, dimethylhydrazine ((CH$_3$)$_2$N$_2$H$_2$, abbreviated to: DMH) gas, trimethylhydrazine ((CH$_3$)$_2$N$_2$(CH$_3$)H, abbreviated to: TMH) gas or the like, or ethylhydrazine-based gas such as ethylhydrazine ((C$_2$H$_5$)HN$_2$H$_2$, abbreviated to: EH) gas or the like may be used. Also, as the gas including N—H bond, ethylamine-based gas such as triethylamine ((C$_2$H$_5$)$_3$N, abbreviated to: TEA) gas, diethylamine ((C$_2$H$_5$)$_2$NH, abbreviated to: DEA) gas, monoethylamine (C$_2$H$_5$NH$_2$, abbreviated to: MEA) gas or the like, methylamine-based gas such as trimethylamine ((CH$_3$)$_3$N, abbreviated to: TMA) gas, dimethylamine ((CH$_3$)$_2$NH, abbreviated to: DMA) gas, monomethylamine (CH$_3$NH$_2$, abbreviated to: MMA) gas or the like, propylamine-based gas such as tripropylamine ((C$_3$H$_7$)$_3$N, abbreviated to: TPA) gas, dipropylamine ((C$_3$H$_7$)$_2$NH, abbreviated to: DPA) gas, monopropylamine (C$_3$H$_7$NH$_2$, abbreviated to: MPA) gas or the like, isopropylamine-based gas such as triisopropylamine ([(CH$_3$)$_2$CH]$_3$N, abbreviated to: TIPA) gas, diisopropylamine ([(CH$_3$)$_2$CH]$_2$NH, abbreviated to: DIPA) gas, monoisopropylamine ((CH$_3$)$_2$CHNH$_2$, abbreviated to: MIPA) gas or the like, butylamine-based gas such as tributylamine ((C$_4$H$_9$)$_3$N, abbreviated to: TBA) gas, dibutylamine ((C$_4$H$_9$)$_2$NH, abbreviated to: DBA) gas, monobutylamine (C$_4$H$_9$NH$_2$, abbreviated to: MBA) gas or the like or isobutylamine-based gas such as triisobutylamine ([(CH$_3$)$_2$CHCH$_2$]$_3$N, abbreviated to: TIBA) gas, diisobutylamine ([(CH$_3$)$_2$CHCH$_2$]$_2$NH, abbreviated to: DIBA) gas, monoisobutylamine ((CH$_3$)$_2$CHCH$_2$NH$_2$, abbreviated to: MBA) gas, monoisobutylamine ((CH$_3$)$_2$CHCH$_2$NH$_2$, abbreviated to: MBA) gas or the like may be used. That is, as amine-based gas, for example, at least one type of gas among gases illustrated by composition formulas such as (C$_2$H$_5$)$_x$NH$_{3-x}$, (CH$_3$)$_x$NH$_{3-x}$, (C$_3$H$_7$)$_x$NH$_{3-x}$, [(CH$_3$)$_2$CH]$_x$NH$_{3-x}$, (C$_4$H$_9$)$_x$NH$_{3-x}$, [(CH$_3$)$_2$CHCH$_2$]$_x$NH$_{3-x}$ (where, x is an integer in a range of 1 to 3) may be used. When organic hydrazine-based gas or amine-based gas is used, since C is added to the film, the work function of the film may be adjusted by controlling the C concentration.

As an oxidizing agent used for the formation of the oxide film and the plasma treatment, an oxygen-containing gas such as oxygen (O$_2$), ozone (O$_3$), water vapor (H$_2$O), hydrogen peroxide (H$_2$O$_2$), nitrous oxide (N$_2$O) or the like may be used.

When a carbide film is formed, as a carbon-containing gas, a hydrocarbon-based gas such as Hf[C$_5$H$_4$(CH$_3$)]$_2$(CH$_3$)$_2$, octane (C$_8$H$_{16}$), ethylene (C$_2$H$_4$), propylene (C$_3$H$_6$), butene (C$_4$H$_8$), pentene (C$_5$H$_{10}$), hexene (C$_6$H$_{12}$), heptene (C$_7$H$_{14}$), ethane (C$_2$H$_6$), propane (C$_3$H$_8$), butane (C$_4$H$_{10}$), pentane (C$_5$H$_{12}$), hexane (C$_6$H$_{14}$), heptane (C$_7$H$_{16}$), 1-octene (C$_8$H$_{16}$) gas, octane (C$_8$H$_{18}$) or the like, that is, at least one source of organic sources such as CxH$_{2x}$ and CxH$_{2(x+2)}$ (where, x is an integer of 1 or more (x>1)) may be used.

As a reducing agent used in plasma treatment, in addition to hydrogen (H$_2$), deuterium (HD), ammonia (NH$_3$) or the like may be used.

As a nitriding agent used in plasma treatment, a gas including N—H bond such as nitrogen (N$_2$), nitrous oxide (N$_2$O), diazine (N$_2$H$_2$) gas, hydrazine (N$_2$H$_4$) gas, N$_3$H$_8$ gas or the like may be used. Also, as the gas including N—H bond, in addition to the above-described gases, organic hydrazine-based gas, for example, methylhydrazine-based gas such as monomethylhydrazine ((CH$_3$)HN$_2$H$_2$, abbreviated to: MMH) gas, dimethylhydrazine ((CH$_3$)$_2$N$_2$H$_2$, abbreviated to: DMH) gas, trimethylhydrazine ((CH$_3$)$_2$N$_2$(CH$_3$)H, abbreviated to: TMH) gas or the like, or ethylhydrazine-based gas such as ethylhydrazine ((C$_2$H$_5$)HN$_2$H$_2$, abbreviated to: EH) gas or the like may be used. Also, as the gas including N—H bond, ethylamine-based gas such as triethylamine ((C$_2$H$_5$)$_3$N, abbreviated to: TEA) gas, diethylamine ((C$_2$H$_5$)$_2$NH, abbreviated to: DEA) gas, monoethylamine (C$_2$H$_5$NH$_2$, abbreviated to: MEA) gas or the like, methylamine-based gas such as trimethylamine ((CH$_3$)$_3$N, abbreviated to: TMA) gas, dimethylamine ((CH$_3$)$_2$NH, abbreviated to: DMA) gas, monomethylamine (CH$_3$NH$_2$, abbreviated to: MMA) gas or the like, propylamine-based gas such as tripropylamine ((C$_3$H$_7$)$_3$N, abbreviated to: TPA) gas, dipropylamine ((C$_3$H$_7$)$_2$NH, abbreviated to: DPA) gas, monopropylamine (C$_3$H$_7$NH$_2$, abbreviated to: MPA) gas or the like, isopropylamine-based gas such as triisopropylamine ([(CH$_3$)$_2$CH]$_3$N, abbreviated to: TIPA) gas, diisopropylamine ([(CH$_3$)$_2$CH]$_2$NH, abbreviated to: DIPA) gas, monoisopropylamine ((CH$_3$)$_2$CHNH$_2$, abbreviated to: MIPA) gas or the like, butylamine-based gas such as tributylamine ((C$_4$H$_9$)$_3$N, abbreviated to: TBA) gas, dibutylamine ((C$_4$H$_9$)$_2$NH, abbreviated to: DBA) gas, monobutylamine (C$_4$H$_9$NH$_2$, abbreviated to: MBA) gas or the like or isobutylamine-based gas such as triisobutylamine ([(CH$_3$)$_2$CHCH$_2$]$_3$N, abbreviated to: TIBA) gas, diisobutylamine ([(CH$_3$)$_2$CHCH$_2$]$_2$NH, abbreviated to: DIBA) gas, monoisobutylamine ((CH$_3$)$_2$CHCH$_2$NH$_2$, abbreviated to: MIBA) gas or the like may be used. That is, as amine-based gas, for example, at least one type of gas among gases illustrated by composition formulas such as (C$_2$H$_5$)$_x$NH$_{3-x}$, (CH$_3$)$_x$NH$_{3-x}$, (C$_3$H$_7$)$_x$NH$_{3-x}$, [(CH$_3$)$_2$CH]$_x$NH$_{3-x}$, (C$_4$H$_9$)$_x$NH$_{3-x}$, [(CH$_3$)$_2$CHCH$_2$]$_x$NH$_{3-x}$ (where, x is an integer in a range of 1 to 3) may be used. When organic hydrazine-based gas or amine-based gas is used, since C is added to the film, the work function of the film may be adjusted by controlling the C concentration.

As an inert gas, in addition to the N$_2$ gas, rare gases such as argon (Ar) gas, helium (He) gas, neon (Ne) gas, xenon (Xe) gas and the like may be used.

Also, as a discharge mechanism, in addition to magnetron discharge plasma, capacitive coupled plasma (CCP), inductively coupled plasma (ICP), surface wave plasma (SWP), microwave plasma or the like may be used.

The above-described embodiments, modifications and the like may be appropriately combined and used. Also, processing conditions in this case may be the same as, for example, the processing conditions of the above-described embodiment.

A process recipe (a program in which processing sequences, processing conditions, and the like are described) used in the formation of various types of thin films may be preferably separately prepared (prepared in a plurality of process recipes) according to content (a film type, a composition ratio, film quality, film thickness, processing sequences, processing conditions, and the like of the thin film to be formed) of substrate processing. Also, when the substrate processing starts, an appropriate process recipe is preferably appropriately selected from the plurality of process recipes according to content of the substrate processing. Specifically, the plurality of process recipes separately prepared according to content of the substrate processing are preferably pre-stored (installed) in the memory device 121c provided in the substrate processing apparatus through telecommunication lines or the non-transitory computer-readable recording medium [the external memory device 123] recording the process recipe. Also, when the substrate processing starts, the CPU 121a provided in the substrate processing apparatus preferably appropriately selects an appropriate process recipe according to content of the substrate process from the plurality of process recipes stored in the memory device 121c. In such a configuration, it is possible to generally and repeatedly form the thin film having various film types, composition ratios, film qualities, and film thicknesses in a single substrate processing apparatus. Also, it is possible to decrease an operation load (such as a load for inputting processing sequences or processing conditions) of an operator, thereby preventing operation errors and quickly starting the substrate processing.

In addition to creating a new process recipe, the above-described process recipe may be prepared by, for example, changing an existing process recipe that is previously installed in the substrate processing apparatus. When the process recipe is changed, the changed process recipe according to the present invention may be installed in the substrate processing apparatus through a telecommunication line or a non-transitory computer-readable recording medium recording the process recipe. Also, by manipulating the I/O device provided in the existing substrate processing apparatus, the existing process recipe that is previously installed in the substrate processing apparatus may be changed to the process recipe according to the present invention.

According to the present invention, an impurity remaining in a thin film when the film is formed can be removed and the characteristics of the thin film can be modified according to a change in impurity concentration.

Preferred Embodiments of the Present Invention

Hereinafter, preferred embodiments according to the present invention are supplementarily noted.

<Supplementary Note 1>

According to an aspect of the present invention, there is provided a method of manufacturing a semiconductor device or a substrate processing method including:

(a) exciting a modifying gas including a reducing agent (reducing gas) and at least one of a nitriding agent (nitriding gas) and an oxidizing agent (oxidizing gas) by plasma; and (b) supplying the modifying gas excited by plasma to a film formed on a substrate to modify the film.

<Supplementary Note 2>

In the method of manufacturing the semiconductor device or the substrate processing method of Supplementary note 1, preferably, an impurity in the film is removed by supplying the modifying gas excited by plasma to the film in the step (b).

<Supplementary Note 3>

In the method of manufacturing the semiconductor device or the substrate processing method of any one of Supplementary notes 1 and 2, preferably, the reducing agent includes a hydrogen-containing gas, and the hydrogen-containing gas includes one selected from a group consisting of $H_2$ gas, $D_2$ gas, $NH_3$ gas and $H_2O$ gas. Preferably, the hydrogen-containing gas includes one selected from a group consisting of $H_2$ gas and D2 gas.

<Supplementary Note 4>

In the method of manufacturing the semiconductor device or the substrate processing method of any one of Supplementary notes 1 through 3, preferably, the nitriding agent includes a nitrogen-containing gas, and the nitrogen-containing gas includes one selected from a group consisting of $N_2$ gas, $NH_3$ gas and $N_2O$ gas. Preferably, the nitrogen-containing gas includes $N_2$ gas.

<Supplementary Note 5>

In the method of manufacturing the semiconductor device or the substrate processing method of any one of Supplementary notes 1 through 3, preferably, the oxidizing agent includes an oxygen-containing gas, and the oxygen-containing gas includes one selected from a group consisting of $O_2$ gas, $O_3$ gas, $H_2O$ gas, $H_2O_2$ gas and $N_2O$ gas. Preferably, the oxygen-containing gas includes $O_2$ gas.

<Supplementary Note 6>

In the method of manufacturing the semiconductor device or the substrate processing method of any one of Supplementary notes 1 through 5, preferably, the film includes one selected from a group consisting of a nitride film, an oxide film, a carbide film and combinations thereof, each of the nitride film, the oxide film, the carbide film and combinations thereof includes one selected from a group consisting of titanium (Ti), tantalum (Ta), tungsten (W), cobalt (Co), yttrium (Y), ruthenium (Ru), aluminum (Al), hafnium (Hf), zirconium (Zr), molybdenum (Mo) and silicon (Si).

<Supplementary Note 7>

In the method of manufacturing the semiconductor device or the substrate processing method of any one of Supplementary notes 1 through 6, preferably, the film includes a conductive film. Preferably, the conductive film includes a metal-containing film.

<Supplementary Note 8>

In the method of manufacturing the semiconductor device or the substrate processing method of any one of Supplementary notes 1 through 7, preferably, an impurity in the film includes at least one selected from a group consisting of carbon (C), chlorine (Cl) and fluorine (F).

<Supplementary Note 9>

In the method of manufacturing the semiconductor device or the substrate processing method of Supplementary note 7, preferably, a resistivity and a work function of the metal-containing film are modified (controlled, adjusted, tuned) by supplying the modifying gas excited by plasma to the metal-containing film in the step (b).

<Supplementary Note 10>

In the method of manufacturing the semiconductor device or the substrate processing method of Supplementary note 9, preferably, the resistivity of the metal-containing film is lowered and the work function of the metal-containing film is elevated by supplying the modifying gas excited by plasma to the metal-containing film in the step (b).

<Supplementary Note 11>

In the method of manufacturing the semiconductor device or the substrate processing method of any one of Supplementary notes 9 and 10, preferably, the resistivity and the work function of the metal-containing film are modified (controlled, adjusted, tuned) by varying a supply time (a radiation time) of the modifying gas excited by plasma to the metal-containing film in the step (b).

<Supplementary Note 12>

In the method of manufacturing the semiconductor device or the substrate processing method of any one of Supplementary notes 9 through 11, preferably, the resistivity and the work function of the metal-containing film are modified (controlled, adjusted, tuned) by varying a self bias in the step (b).

<Supplementary Note 13>

In the method of manufacturing the semiconductor device or the substrate processing method of any one of Supplementary notes 1 through 12, preferably, further including: (c) forming the film on the substrate, and the film is formed on the substrate by repetitively supplying a plurality of gases including elements constituting the film in temporally separated pulses (in non-simultaneous manner, time-divisionally, asynchronously, intermittently or pulsewisely)

<Supplementary Note 14>

In the method of manufacturing the semiconductor device or the substrate processing method of Supplementary note 13, preferably, the plurality of gases may include an inorganic source gas and at least one selected from a group consisting of the nitriding agent and the oxidizing agent.

<Supplementary Note 15>

In the method of manufacturing the semiconductor device or the substrate processing method of Supplementary note 14, preferably, the inorganic source gas includes a halide and an impurity in the film includes at least one selected from a group consisting of chlorine (Cl) and fluorine (F).

<Supplementary Note 16>

In the method of manufacturing the semiconductor device or the substrate processing method of Supplementary note 13, preferably, the plurality of gases includes an organic source gas and at least one selected from a group consisting of the nitriding agent and the oxidizing agent.

<Supplementary Note 17>

In the method of manufacturing the semiconductor device or the substrate processing method of Supplementary note 16, preferably, an impurity in the film includes carbon (C).

<Supplementary Note 18>

In the method of manufacturing the semiconductor device or the substrate processing method of Supplementary note 13, preferably, the plurality of gases may include an inorganic source gas and an organic source gas.

<Supplementary Note 19>

In the method of manufacturing the semiconductor device or the substrate processing method of Supplementary note 18, preferably, each of the inorganic source gas and the organic source gas includes at least one of elements constituting the film, and preferably, the at least one of the elements constituting the film may include a metal element.

<Supplementary Note 20>

In the method of manufacturing the semiconductor device or the substrate processing method of any one of Supplementary notes 13 through 19, preferably, a thickness of the film formed in the step (c) is determined by a penetration depth of the modifying gas excited by plasma into the film.

<Supplementary Note 21>

In the method of manufacturing the semiconductor device or the substrate processing method of Supplementary note 20, preferably, the thickness of the film ranges from 0.01 nm to 5 nm.

<Supplementary Note 22>

In the method of manufacturing the semiconductor device or the substrate processing method of any one of Supplementary notes 13 through 21, preferably, the steps (b) and (c) may be performed in the same process chamber.

<Supplementary Note 23>

In the method of manufacturing the semiconductor device or the substrate processing method of any one of Supplementary notes 13 through 21, preferably, a process chamber where the step (b) is performed is different from a process chamber where the step (c) is performed.

<Supplementary Note 24>

According to another aspect of the present invention, there is provided a substrate processing apparatus including:

a process chamber configured to accommodate a substrate;

a gas supply system configured to supply a modifying gas including a reducing agent (a reducing gas) and at least one of a nitriding agent (a nitriding gas) and an oxidizing agent (an oxidizing gas);

an excitation unit configured to excite the modifying gas by plasma; and a control unit configured to control the gas supply system and the excitation unit to perform exciting and supplying the modifying gas to a film formed on the substrate to modify the film.

<Supplementary Note 25>

According to still another aspect of the present invention, there is provided a substrate processing system including:

a first substrate processing apparatus configured to form a film on a substrate, the first substrate processing apparatus including: a first process chamber configured to accommodate the substrate; and a first gas supply system configured to supply a process gas including elements constituting the film;

a second substrate processing apparatus configured to modify the film formed on the substrate, the second substrate processing apparatus including: a second process chamber configured to accommodate the substrate; a second gas supply system configured to supply a modifying gas including a reducing agent (a reducing gas) and at least one of a nitriding agent (a nitriding gas) and an oxidizing agent (an oxidizing gas); and an excitation unit configured to excite the modifying gas by plasma; and a control unit configured to control the first gas supply system, the second gas supply system and the excitation unit to perform: (a) supplying the process gas to form the film on the substrate accommodated in the first process chamber; and (b) exciting and supplying the modifying gas to the substrate with the film formed thereon accommodated in the second process chamber to modify the film.

<Supplementary Note 26>

According to still another aspect of the present invention, there is provided a substrate processing apparatus including:

a process chamber configured to accommodate a substrate;

a first gas supply system configured to supply a process gas including elements constituting a film;

a second gas supply system configured to supply a modifying gas including a reducing agent (a reducing gas) and at least one of a nitriding agent (a nitriding gas) and an oxidizing agent (an oxidizing gas);

an excitation unit configured to excite the modifying gas by plasma; and a control unit configured to control the first gas supply system, the second gas supply system and the excitation unit to perform: (a) supplying the process gas to form the film on the substrate; and (b) exciting and supplying the modifying gas to the substrate to modify the film.

<Supplementary Note 27>

According to still another aspect of the present invention, there is provided a program or a non-transitory computer-readable recording medium storing a program for causing a computer to control a substrate processing apparatus to perform:

(a) exciting a modifying gas including a reducing agent (reducing gas) and at least one of a nitriding agent (nitriding gas) and an oxidizing agent (oxidizing gas) by plasma; and (b) supplying the modifying gas excited by plasma to a film formed on a substrate to modify the film.

What is claimed is:

1. A method of manufacturing a semiconductor device, comprising:
   (a) plasma-exciting a modifying gas comprising a reducing agent and an organic amine based gas nitriding agent; and
   (b) modifying a conductive metal nitride film containing an impurity by supplying the modifying gas plasma-excited in (a) to the conductive metal nitride film,
   wherein, in (b), the reducing agent plasma-excited in (a) is supplied first and the organic nitriding agent plasma-excited in (a) is supplied second.

2. The method of claim 1, wherein, in (b), a supply of the organic nitriding agent plasma-excited in (a) is started after stopping a supply of the reducing agent plasma-excited in (a) is stopped.

3. The method of claim 1, wherein a supply of the organic nitriding agent plasma-excited in (a) is started during a supply of the reducing agent plasma-excited in (a).

4. The method of claim 1, wherein, in (b), a supply of the reducing agent plasma-excited in (a) is stopped during a supply of the organic nitriding agent plasma-excited in (a).

5. The method of claim 1, wherein (b) comprises:
   (b-1) removing the impurity from the conductive metal nitride film by supplying the reducing agent plasma-excited in (a); and
   (b-2) injecting nitrogen contained in the organic nitriding agent into a portion of the conductive metal nitride film having the impurity removed by supplying the nitriding agent plasma-excited in (a).

6. The method of claim 1, wherein, in (b), a crystallization of the conductive metal nitride film is stimulated by supplying the organic nitriding agent plasma-excited in (a).

7. The method of claim 1, further comprising: (c) removing a residual gas remaining on the conductive metal nitride film after a supply of the modifying gas plasma-excited in (a) is stopped, wherein a cycle of alternately performing (b) and (c) is repeated.

8. The method of claim 7, wherein a duration of the supply of the modifying gas plasma-excited in (a) is adjusted to control a resistivity of the conductive metal nitride film.

9. The method of claim 8, wherein the duration of the supply of the modifying gas is adjusted by controlling a number of times the cycle is repeated.

10. The method of claim 7, wherein the cycle is repeated two or more times.

11. The method of claim 1, wherein the reducing agent is deuterium gas.

12. The method of claim 1, wherein the organic nitriding agent is an ethylamine-based gas.

13. The method of claim 1, wherein the organic nitriding agent is a propylamine-based gas.

14. The method of claim 1, wherein the organic nitriding agent is an isobutylamine-based gas.

15. The method of claim 1, wherein the reducing agent is $NH_3$ gas.

16. The method of claim 1, wherein the reducing agent is $H_2O$ gas.

* * * * *